United States Patent
Shreevastav et al.

(10) Patent No.: US 11,246,059 B2
(45) Date of Patent: Feb. 8, 2022

(54) TRANSMITTING DEVICE, RECEIVING DEVICE, AND METHODS PERFORMED THEREIN FOR HANDLING BUFFER RESET

(71) Applicant: Telefonaktiebolaget LM Ericsson (publ), Stockholm (SE)

(72) Inventors: Ritesh Shreevastav, Upplands Väsby (SE); Mattias Bergström, Sollentuna (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 16/756,529

(22) PCT Filed: Nov. 12, 2018

(86) PCT No.: PCT/SE2018/051150
§ 371 (c)(1),
(2) Date: Apr. 16, 2020

(87) PCT Pub. No.: WO2019/093961
PCT Pub. Date: May 16, 2019

(65) Prior Publication Data
US 2020/0296623 A1    Sep. 17, 2020

Related U.S. Application Data

(60) Provisional application No. 62/584,165, filed on Nov. 10, 2017.

(51) Int. Cl.
*H04W 28/06* (2009.01)
*H04L 29/06* (2006.01)

(52) U.S. Cl.
CPC ............. *H04W 28/06* (2013.01); *H04L 69/04* (2013.01); *H04L 69/22* (2013.01)

(58) Field of Classification Search
CPC .......... H03M 7/30; H04L 69/22; H04L 69/04; H04W 28/06; H04W 56/00; H04N 19/196; H04N 19/129; H04N 19/149
See application file for complete search history.

(56) References Cited

U.S. PATENT DOCUMENTS 5,966,374 A * 10/1999 Rasanen ............... H04B 7/2646
370/337
2006/0139681 A1 * 6/2006 Walmsley ............. G06F 21/606
358/1.14

(Continued)

FOREIGN PATENT DOCUMENTS

| EP | 3665973 A1 | 6/2020 |
| WO | 2019086032 A1 | 5/2019 |

OTHER PUBLICATIONS

PCT International Search Report and Written Opinion, dated Feb. 15, 2019, for International Application No. PCT/SE2018/051150, 12 pages.

(Continued)

*Primary Examiner* — Syed Ali
(74) *Attorney, Agent, or Firm* — Sage Patent Group

(57) ABSTRACT

A method performed by a transmitting device is disclosed herein. The transmitting device operates in a communications network. The transmitting device performs a reset on a buffer of the transmitting device. The transmitting device then switches, based on the performed reset, a first value in an indication to a second value. The indication is of the reset of the buffer. The transmitting device sets the indication to the second value for all packets generated by the transmitting device after the performed reset. This is set until the second value is switched again by the transmitting device in another indication, based on another performed reset of the buffer. The transmitting device then sends the indication with the second value to a receiving device operating in the (Continued)

(a) Before compression (b) After compression communications network. The second value indicates that the reset was performed by the transmitting device.

4 Claims, 12 Drawing Sheets

(56) References Cited

U.S. PATENT DOCUMENTS

| | | | | |
|---|---|---|---|---|
| 2010/0118971 | A1* | 5/2010 | Tanida | H04N 19/13 375/240.23 |
| 2010/0135330 | A1* | 6/2010 | Liang | H04L 69/22 370/477 |
| 2013/0322336 | A1* | 12/2013 | Cheng | H04W 4/185 370/328 |
| 2014/0233376 | A1 | 8/2014 | Yu | |
| 2015/0085835 | A1 | 3/2015 | Eravelli et al. | |
| 2016/0142518 | A1* | 5/2016 | Raina | H04L 69/04 370/230 |
| 2016/0142934 | A1* | 5/2016 | Ahmadzadeh | H04W 72/04 370/328 |
| 2016/0142951 | A1* | 5/2016 | Balasubramanian | H04W 36/023 370/331 |
| 2016/0309364 | A1* | 10/2016 | Maheshwari | H04L 69/04 |
| 2016/0337255 | A1 | 11/2016 | Balasubramanian et al. | |
| 2019/0149421 | A1* | 5/2019 | Jin | H04L 5/0053 370/331 |
| 2020/0169914 | A1* | 5/2020 | Govil | H04W 28/0294 |
| 2020/0396640 | A1* | 12/2020 | Quan | H04L 67/2842 |

OTHER PUBLICATIONS

Ericsson: "Release and Reset Behaviour for UDC", 3GPP TSG-RAN WG2 #97, R2-1713357, Reno, USA, Nov. 27-Dec. 1, 2017, 8 pages.

CATT: "Consideration on Signalling and Procedures for UDC", 3GPP TSG RAN WG2 Meeting #99bis, R2-1710721, Prague, Czech Republic, Oct. 9-13, 2017, 4 pages.

CATT: "Consideration on UDC Header Content", 3GPP TSG-RAN WG2 #99bis, R2-1710720, Prague, Czech Republic, Oct. 9-13, 2017, 3 pages.

Extended European Search Report for European Patent Application No. 18876486.4 dated Jul. 19, 2021, 11 pages.

CATT, 3GPP TSG-RAN WG2 #99, R2-1708358, "More Details and Simulation Results of Deflate with 1 Byte UDC Header", Berlin, Germany, Aug. 21-25, 2017, 7 pages.

CATT, 3GPP TSG-RAN2 Meeting #99, R2-1708359, "Update of Description and Evaluation Results for Deflate", Berlin, Germany, Aug. 21-25, 2017, 8 pages.

* cited by examiner (a) Before compression (b) After compression a)

b)

a)

b)

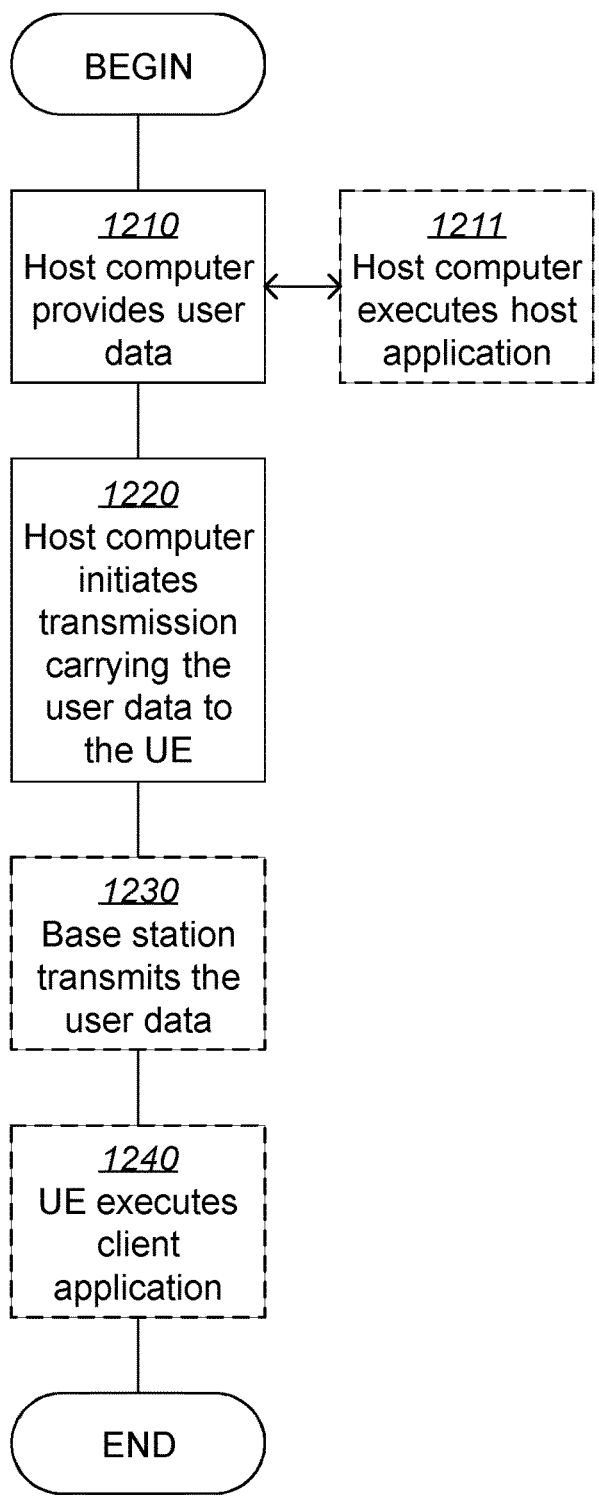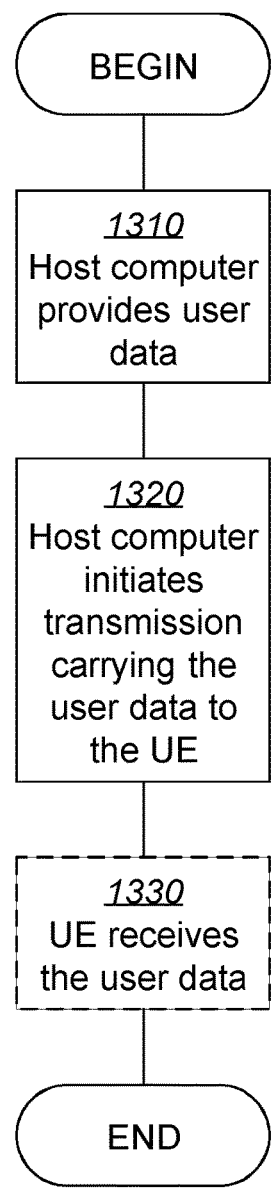
FIG. 12
FIG. 13

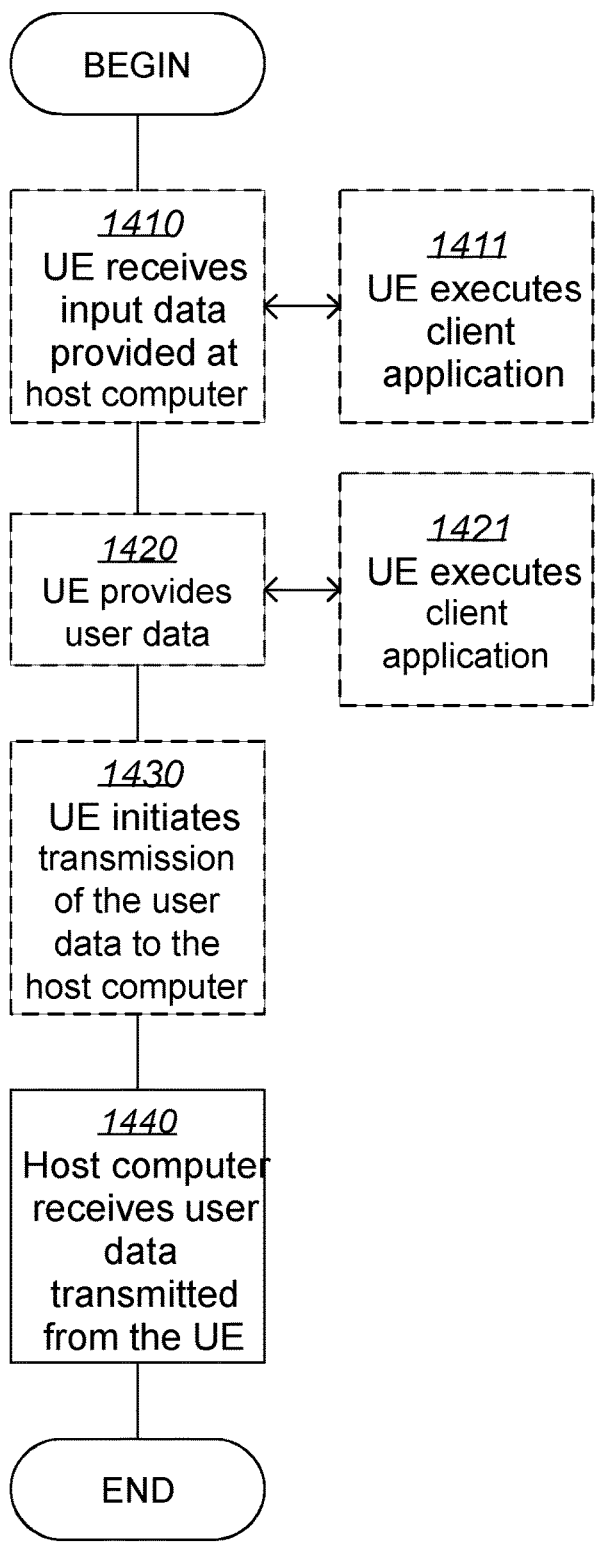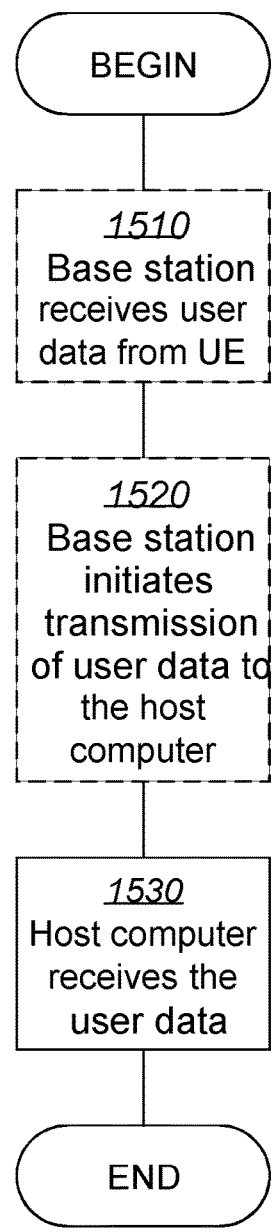
FIG. 14
FIG. 15

TRANSMITTING DEVICE, RECEIVING DEVICE, AND METHODS PERFORMED THEREIN FOR HANDLING BUFFER RESET

CROSS-REFERENCE TO RELATED APPLICATIONS

This application is a 35 U.S.C § 371 national stage application for International Application No. PCT/SE2018/051150, entitled "TRANSMITTING DEVICE, RECEIVING DEVICE, AND METHODS PERFORMED THEREIN FOR HANDLING BUFFER RESET", filed on Nov. 12, 2018, which claims priority to U.S. Provisional Patent Application No. 62/584,165, filed on Nov. 10, 2017, the disclosures and contents of which are hereby incorporated by reference in their entireties.

TECHNICAL FIELD

The present disclosure relates generally to a transmitting device and methods performed thereby for handling a buffer reset. The present disclosure also relates generally to a receiving device and methods performed thereby for handling the buffer reset.

BACKGROUND

Communication devices within a wireless communications network may be wireless devices such as e.g., User Equipments (UEs), stations (STAs), mobile terminals, wireless terminals, terminals, and/or Mobile Stations (MS). Wireless devices are enabled to communicate wirelessly in a cellular communications network or wireless communication network, sometimes also referred to as a cellular radio system, cellular system, or cellular network. The communication may be performed e.g. between two wireless devices, between a wireless device and a regular telephone, and/or between a wireless device and a server via a Radio Access Network (RAN), and possibly one or more core networks, comprised within the wireless communications network. Wireless devices may further be referred to as mobile telephones, cellular telephones, laptops, or tablets with wireless capability, just to mention some further examples. The wireless devices in the present context may be, for example, portable, pocket-storable, hand-held, computer-comprised, or vehicle-mounted mobile devices, enabled to communicate voice and/or data, via the RAN, with another entity, such as another terminal or a server.

Communication devices may also be network nodes, such as radio network nodes, e.g., Transmission Points (TP). The wireless communications network covers a geographical area which may be divided into cell areas, each cell area being served by a network node such as a Base Station (BS), e.g. a Radio Base Station (RBS), which sometimes may be referred to as e.g., gNB, evolved Node B ("eNB"), "eNodeB", "NodeB", "B node", or BTS (Base Transceiver Station), depending on the technology and terminology used. The base stations may be of different classes such as e.g. Wide Area Base Stations, Medium Range Base Stations, Local Area Base Stations and Home Base Stations, based on transmission power and thereby also cell size. A cell is the geographical area where radio coverage is provided by the base station at a base station site. One base station, situated on the base station site, may serve one or several cells. Further, each base station may support one or several communication technologies. The wireless communications network may also be a non-cellular system, comprising network nodes which may serve receiving nodes, such as wireless devices, with serving beams. In 3rd Generation Partnership Project (3GPP) Long Term Evolution (LTE), base stations, which may be referred to as eNodeBs or even eNBs, may be directly connected to one or more core networks. In the context of this disclosure, the expression Downlink (DL) may be used for the transmission path from the base station to the wireless device. The expression Uplink (UL) may be used for the transmission path in the opposite direction i.e., from the wireless device to the base station.

A work item on Uplink Data Compression (UDC) in LTE has been brought in Release (Rel)-15 of LTE [4]. The motivation for this study is that the air interface may get congested and hence it may, in some scenarios, be beneficial to compress the data in Uplink before it may be sent over the air interface.

One proposed solution is that in the Packet Data Convergence Protocol (PDCP) layer of LTE the possibility to compress Service Data Units (SDUs) at the transmitter is introduced. The receiver may then, upon reception of a packet, decompress the data and forward the result to higher layers. The compression solution is based upon "DEFLATE" [1,3].

Deflate uses LZ77 and Huffman encoding based compression algorithms. Deflate further uses Huffman coding, Variable length encoding, to further compress some of the parameters and output of LZ77.

The LZ77 algorithm achieves compression by replacing repeated occurrences of data with an 8+15 bit <length, distance>-pair that specifies an earlier copy of the data in the previous uncompressed data stream. The length parameter indicates the length of the matching copy of data, and the distance parameter indicates how far back in the previous uncompressed data stream the duplicate occurred. To find matches, the compressor may need to keep a certain amount of the most recent data in a sliding window buffer. In the same way, the decompressor may need to have access to the same data to be able to interpret the matches referred to in the compressed packet. For compression/de-compression to work, it may be understood to be necessary that the buffered data on the compressor and the decompression side are synchronized; any loss of data would force the algorithm out-of-synch.

In the DEFLATE algorithm, the length of the matching pattern is restricted to 3-258 bytes, with a lookback length (distance) of maximum 32 KB. However, 3GPP will have an agreement to maximum support for the buffer size of 8K bytes.

UDC algorithm based upon DEFLATE may need to have a buffer memory context on the compressor and decompressor side. For example, to perform cross-packet compression, in Deflate, a First-In-First-Out (FIFO) buffer may be used to buffer original packets which have been compressed. Within the packets which have not been compressed, if a repeated string in buffer is identified, a back-reference may be inserted linking it to the previous location and the length of that identified string as shown in FIG. 1. FIG. 1 is a schematic diagram illustrating an example of DEFLATE before compression in panel a), and after compression, in panel b).

In FIG. 1, the buffer size in the compression entity, e.g., a UE, is 8 bytes. Each byte is numbered from 0 to 7. When a new packet which has a content of "bcd", as illustrated on the right side of panel a), comes in to the compression entity, a cross-packet match may be identified in the buffer, with the previous position 6, length 3. The new packet, which original length is 3 bytes, may be compressed to 6 bits, as illustrated on the left side of panel b), that is, 3 bits to identify any of the 8 positions in the buffer where the match starts, and 3 bits for length. After compression, the new packet is inserted in the buffer. The decompressor similarly has a decompression entity with same buffer content so that it may decompress the compressed packet.

It may be understood to be necessary that the reliability of the content of packets is maintained. If a compressed packet is corrupt, the eNB may be able to detect it. Generally, a Cyclic Redundancy Check (CRC) mechanism, such as a parity bit, may be used to ensure that the sender and receiver are in sync, and that there is no corruption of the data. In the same way, for a buffer based compression scheme, it may be understood to be necessary to check on the compressor and decompressor side that the content of buffer is the same. However, if the compressor and decompressor are out of sync, it may be necessary for the buffer to be reset.

After an error occurs in communications between the compressor and the decompressor, such as when compressor and decompressor are found to be out of sync, existing methods may lead to ambiguity the in communications. The ambiguity on the receiver side may be understood to be whether the incoming packets were transmitted before the reset or after the reset. This ambiguity may lead to more packets being discarded, and having the risk of deteriorating the Quality of Service (QoS), and releasing the UDC configuration or releasing the complete connection, thereby deteriorating the efficiency of the communications

SUMMARY

It is an object of embodiments herein to improve the handling of errors in a communications network. It is a particular object of embodiments herein to improve the handling of errors in communications between a compressor and a decompressor.

According to a first aspect of embodiments herein, the object is achieved by a method performed by a transmitting device. The transmitting device operates in a communications network. The transmitting device sends an indication to a receiving device. The receiving device performs a reset on a buffer of the transmitting device. The transmitting device switches, based on the performed reset, a first value in an indication to a second value. The indication is of the reset of the buffer. The transmitting device sets the indication to the second value for all packets generated by the transmitting device after the performed reset. This is set until the second value is switched again by the transmitting device in another indication, based on another performed reset of the buffer. The transmitting device then sends the indication with the second value to a receiving device. The receiving device operates in the communications network. The second value indicates that the reset was performed by the transmitting device.

According to a second aspect of embodiments herein, the object is achieved by a method performed by the receiving device. The receiving device operates in the communications network. The receiving device receives the indication with the second value from the transmitting device operating in the communications network. The second value indicates that the reset on the buffer of the transmitting device was performed by the transmitting device. The indication is set to the second value for all packets generated by the transmitting device after the performed reset, until another indication with the second value switched is received from the transmitting device, based on another performed reset of the buffer. The receiving device then processes, based on the received indication, one or more packets received from the transmitting device.

According to a third aspect of embodiments herein, the object is achieved by the transmitting device, configured to operate in the communications network. The transmitting device is further configured to perform the reset on the buffer of the transmitting device. The transmitting device is further configured to switch, based on the reset configured to be performed, the first value in the indication to the second value. The indication is configured to be of the reset of the buffer. The transmitting device is also configured to set the indication to the second value for all packets configured to be generated by the transmitting device after the reset configured to be performed. This is set until the second value is configured to be switched again by the transmitting device in another indication, based on another reset of the buffer configured to be performed. The transmitting device is also configured to send the indication with the second value to the receiving device configured to operate in the communications network. The second value is configured to indicate that the reset was performed by the transmitting device.

According to a fourth aspect of embodiments herein, the object is achieved by the receiving device, configured to operate in the communications network. The receiving device is configured to receive the indication with the second value from the transmitting device configured to operate in the communications network. The second value is configured to indicate that the reset on the buffer of the transmitting device was performed by the transmitting device. The indication is configured to be set to the second value for all packets configured to be generated by the transmitting device after the reset configured to be performed, until another indication with the second value switched is configured to be received from the transmitting device, based on another reset of the buffer configured to be performed. The receiving device is further configured to process, based on the indication configured to be received, the one or more packets configured to be received from the transmitting device.

According to a fifth aspect of embodiments herein, the object is achieved by a computer program, comprising instructions which, when executed on at least one processor, cause the at least one processor to carry out the method performed by the transmitting device.

According to a sixth aspect of embodiments herein, the object is achieved by a computer-readable storage medium, having stored thereon the computer program, comprising instructions which, when executed on at least one processor, cause the at least one processor to carry out the method performed by the transmitting device.

According to a seventh aspect of embodiments herein, the object is achieved by a computer program, comprising instructions which, when executed on at least one processor, cause the at least one processor to carry out the method performed by the receiving device.

According to an eighth aspect of embodiments herein, the object is achieved by a computer-readable storage medium, having stored thereon the computer program, comprising instructions which, when executed on at least one processor, cause the at least one processor to carry out the method performed by the receiving device.

By the transmitting device sending the indication to the receiving device, with the first value in the indication switched to the second value, the transmitting device enables the receiving device to know whether the transmitting device has reset or not the buffer. Consequently, the receiving device may know how to process the packets received from the transmitting device, based on the indication. That is, the receiving device may determine whether to discard or refrain from discarding the packets received from the transmitting device. As a result, reliability of the communications between the transmitting device and the receiving device is increased and ambiguity may be avoided, which in turn increases the efficiency with which resources in the communications network may be used.

BRIEF DESCRIPTION OF THE DRAWINGS

Examples of embodiments herein are described in more detail with reference to the accompanying drawings, and according to the following description.

FIG. 12 is a flowchart depicting embodiments of a method in a communications system including a host computer, a base station and a user equipment, according to embodiments herein.

FIG. 13 is a flowchart depicting embodiments of a method in a communications system including a host computer, a base station and a user equipment, according to embodiments herein.

FIG. 14 is a flowchart depicting embodiments of a method in a communications system including a host computer, a base station and a user equipment, according to embodiments herein.

FIG. 15 is a flowchart depicting embodiments of a method in a communications system including a host computer, a base station and a user equipment, according to embodiments herein.

DETAILED DESCRIPTION

Figure 1:
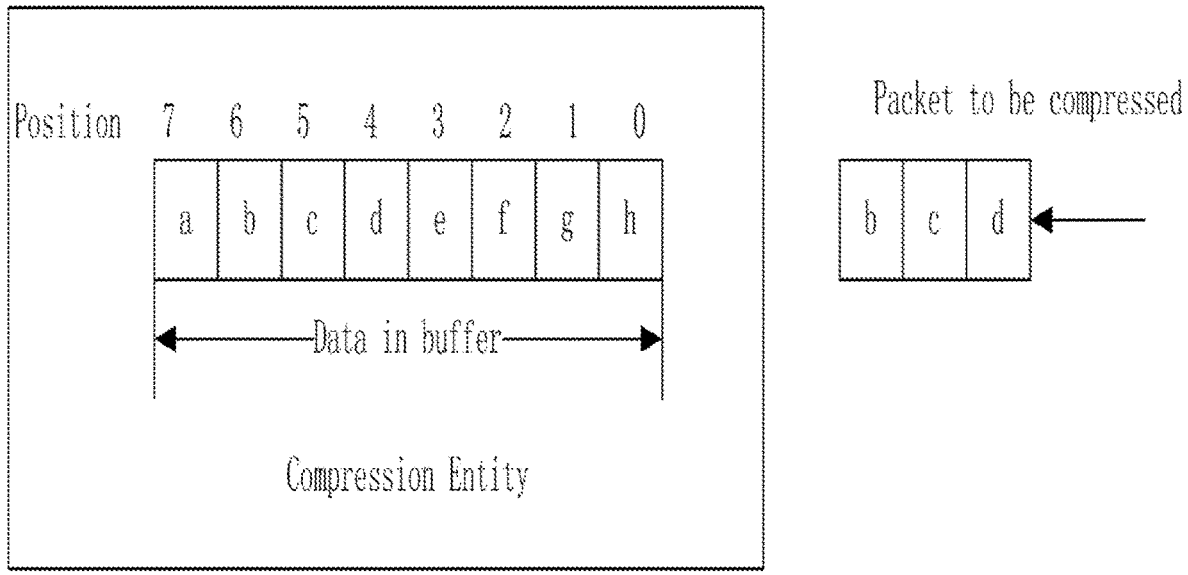
FIG. 1 is a schematic diagram illustrating data compression, according to existing methods.
Figure 1:
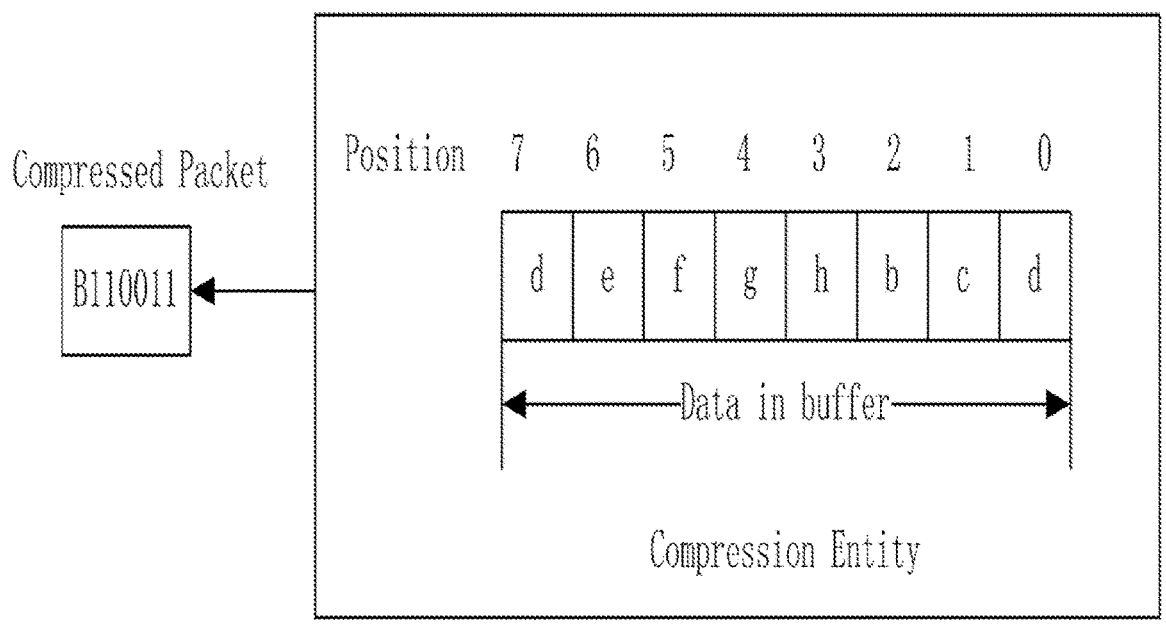

As part of the development of embodiments herein, one or more problems with the existing technology will first be identified and discussed.

Out of sync conditions between an UL compressor, e.g., a UE, and a decompressor, e.g., an eNB, may happen when data compression is used. The checksum may be used by the decompressor to detect UL compression memory out of sync' conditions between the UL compressor and decompressor. After the discovery of an out of sync condition, the decompressor may need to notify the compressor. The compressor may then perform a buffer reset. A buffer reset may be understood as resetting the buffer comment to initial pre-defined values or initializing with all Zero or Null values. A buffer reset may be understood to have the effect of addressing any synchronization issues, e.g., mismatch, between buffer content of the sender and receiver, by enabling to regain synchronization. This may be achieved by allowing the transmitter to initiate compression of the packet again, which in turn may lead to the successful decompression by the receiver. After the notification, the decompressor may also need to be able to identify whether the incoming packets are the packets before the reset or after the reset was performed. If this is not identified, the decompressor entity, e.g., the eNB PDCP, will not know whether to discard the packet or to forward the packet to the upper layer.

Certain aspects of the present disclosure and their embodiments may provide solutions to this challenge or other challenges. There are, proposed herein, various embodiments which address one or more of the issues disclosed herein.

Embodiments herein may be understood to address this problem as to how the communication may need to be performed between compressor and decompressor after the detection of a checksum failure. Embodiments herein may be understood to relate to a method to reset the uplink data compression buffer, e.g., UDC, and to the communication thereafter between the compressor and the decompressor. Embodiments herein may be understood to enable to provide reliable and efficient communication behavior after a checksum failure between a compressor, e.g., an UE, and decompressor, e.g., an eNB.

Some of the embodiments contemplated will now be described more fully hereinafter with reference to the accompanying drawings, in which examples are shown. In this section, the embodiments herein will be illustrated in more detail by a number of exemplary embodiments. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art. It should be noted that the exemplary embodiments herein are not mutually exclusive. Components from one embodiment may be tacitly assumed to be present in another embodiment and it will be obvious to a person skilled in the art how those components may be used in the other exemplary embodiments.

Note that although terminology from LTE has been used in this disclosure to exemplify the embodiments herein, this should not be seen as limiting the scope of the embodiments herein to only the aforementioned system. Other wireless systems with similar features, may also benefit from exploiting the ideas covered within this disclosure.

Figure 2:
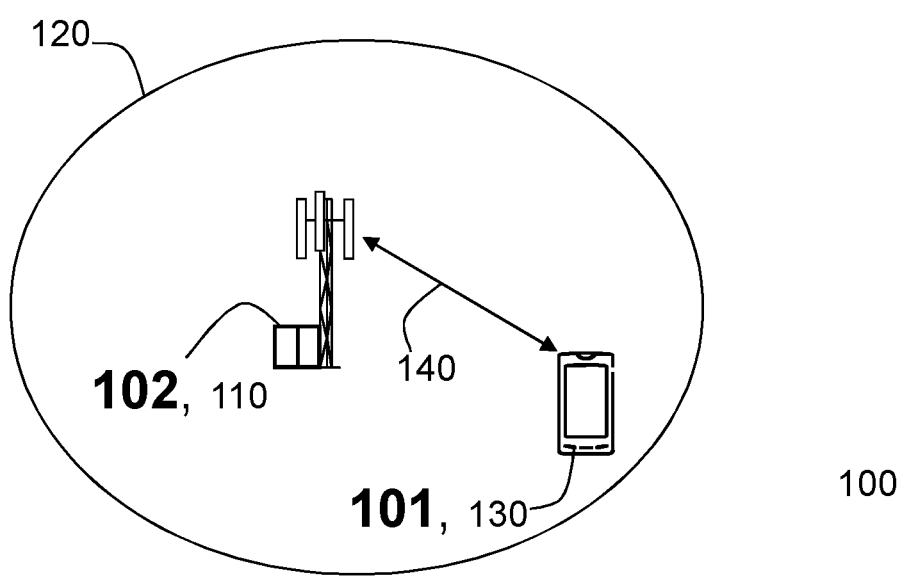
FIG. 2 is a schematic diagram illustrating a communications network, according to embodiments herein.

FIG. 2 depicts a non-limiting example of a communications network 100, sometimes also referred to as a wireless communications system, cellular radio system, or cellular network, in which embodiments herein may be implemented. The communications network 100 may typically be a Long-Term Evolution (LTE) network, e.g., LTE Frequency Division Duplex (FDD), LTE Time Division Duplex (TDD), LTE Half-Duplex Frequency Division Duplex (HD-FDD), LTE operating in an unlicensed band. The communications network 100 may otherwise, or in addition, support other technologies and be for example a 5G system, 5G network, or Next Gen System or network, Wideband Code Division Multiple Access (WCDMA), Universal Terrestrial Radio Access (UTRA) TDD, Global System for Mobile Communications (GSM) network, GSM/Enhanced Data Rate for GSM Evolution (EDGE) Radio Access Network (GERAN) network, Universal Mobile Telecommunications System (UMTS), Ultra-Mobile Broadband (UMB), EDGE network, network comprising of any combination of Radio Access Technologies (RATs) such as e.g. Multi-Standard Radio (MSR) base stations, multi-RAT base stations, or dual connectivity, etc., and/or other suitable 2G, 3G, 4G, or 5G network, wireless local area network (WLAN) network, Worldwide Interoperability for Microwave Access (WiMax), Bluetooth, Z-Wave and/or ZigBee network, or any cellular network or system. Thus, although terminology from 3GPP LTE has been used in this disclosure to exemplify embodiments herein, this should not be seen as limiting the scope of the embodiments herein to only the aforementioned system. Other wireless systems, especially 5G/NR, WCDMA, WiMax, UMB and GSM, may also benefit from exploiting the ideas covered within this disclosure.

The communications network 100 comprises a plurality of communication devices or nodes, whereof a transmitting device 101, and a receiving device 102 are depicted in the non-limiting example of FIG. 2. The transmitting device 101 may be also referred to as a compressor, or compressor device. The receiving device 102 may be also referred to as a decompressor, or decompressor device. The receiving device 102 may typically be a network node, such as a network node 110 described below, e.g., a base station. The transmitting device 101 may typically be a wireless device, such as the wireless device 130 described below.

In other examples which are not depicted in FIG. 2, any of the transmitting device 101 and the receiving device 102 may be wireless devices such as the wireless device 130, e.g., D2D devices. In yet other examples which are not depicted either in FIG. 2, any of the transmitting device 101 and the receiving device 102 may be network nodes such as the network node 110.

The communications network 100 comprises a plurality of network nodes, whereof a network node 110 is depicted in the non-limiting example of FIG. 2. The network node 110 may be a radio network node. That is, a transmission point such as a radio base station, for example an eNB, a New Radio (NR) NodeBs (gNBs), or any other network node with similar features capable of serving a wireless device, such as a user equipment or a machine type communication device, in the communications network 100.

The communications network 100 covers a geographical area which may be divided into cell areas, wherein each cell area may be served by a network node, although, one radio network node may serve one or several cells. The communications network 100 comprises at least a cell 120. In the non-limiting example depicted in FIG. 2, the network node 110 serves the serving cell 120. Even in examples wherein the communications network 100 may not be referred to as a cellular system, if the network node 110 serves receiving nodes, such as the wireless device 130, with serving beams, the areas of coverage of the beams may still be referred to as cells. The network node 110 may be of different classes, such as, e.g., macro eNodeB, home eNodeB or pico base station, based on transmission power and thereby also cell size. The network node 110 may support one or several communication technologies, and its name may depend on the technology and terminology used. In LTE, the network node 110, which may be referred to as an eNB, may be directly connected to one or more core networks, which are not depicted in FIG. 2 to simplify the Figure. In some examples, the network node 110 may be a distributed node, such as a virtual node in the cloud, and it may perform its functions entirely on the cloud, or partially, in collaboration with a radio network node.

A plurality of wireless devices are located in the wireless communication network 100, whereof a wireless device 130, which may also be referred to as a device, is depicted in the non-limiting example of FIG. 2. The wireless device 130 comprised in the communications network 100 may be a wireless communication device such as a UE, or a 5G UE, which may also be known as e.g., a mobile terminal, wireless terminal and/or mobile station, a mobile telephone, cellular telephone, or laptop with wireless capability, just to mention some further examples. Any of the wireless devices comprised in the communications network 100 may be, for example, portable, pocket-storable, hand-held, computer-comprised, or a vehicle-mounted mobile device, enabled to communicate voice and/or data, via the RAN, with another entity, such as a server, a laptop, a Personal Digital Assistant (PDA), or a tablet, Machine-to-Machine (M2M) device, device equipped with a wireless interface, such as a printer or a file storage device, modem, or any other radio network unit capable of communicating over a radio link in a communications system. The wireless device 130 comprised in the communications network 100 is enabled to communicate wirelessly in the communications network 100. The communication may be performed e.g., via a RAN, and possibly the one or more core networks, which may comprised within the communications network 100.

The transmitting device 101 may be configured to communicate within the communications network 100 with the receiving device 102 over a link 140, e.g., a radio link.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

In general, the usage of "first", "second", "third", "fourth" and/or "fifth" herein may be understood to be an arbitrary way to denote different elements or entities, and may be understood to not confer a cumulative or chronological character to the nouns they modify.

Several embodiments are comprised herein. It should be noted that the examples herein are not mutually exclusive. Components from one embodiment may be tacitly assumed to be present in another embodiment and it will be obvious to a person skilled in the art how those components may be used in the other exemplary embodiments.

More specifically, the following are: a) embodiments related to a transmitting device, such as the transmitting device 101, e.g., a UE; and b) embodiments related to a receiving device, such as the receiving device 102, e.g., an eNB. The transmitting device 101 may also be referred to as a compressor, and the receiving device 102 may also be referred to as a decompressor.

Some embodiments herein will now be described with some non-limiting examples. In the following description any reference to a/the UE and/or a/the compressor may be understood to equally apply to the transmitting device 101, and any reference to a/the eNB, and/or a/the network and/or a/the decompressor may be understood to equally apply to the receiving device 102. Any reference to a/the UDC may be understood to be a non-limiting example of an uplink data compression. Any of the examples provided here may be understood to be able to be combined with the embodiments herein, described earlier.

Figure 3:
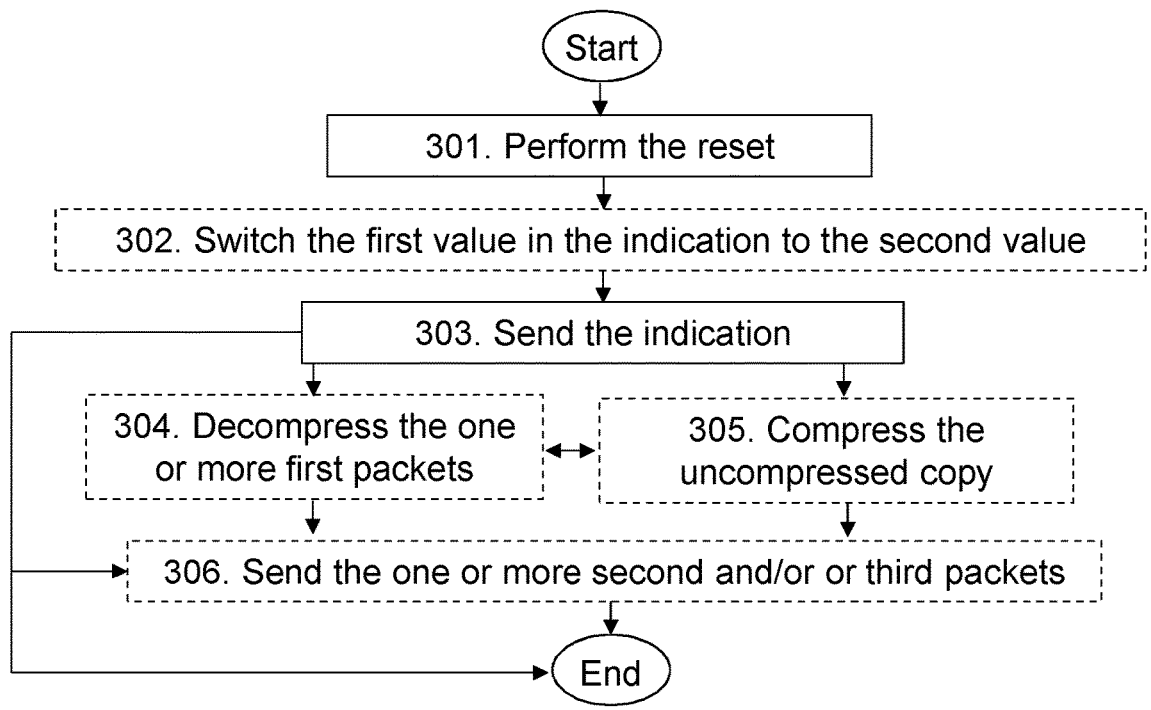
FIG. 3 is a flowchart depicting embodiments of a method in a transmitting device, according to embodiments herein.

Embodiments of a method, performed by the transmitting device 101, will now be described with reference to the flowchart depicted in FIG. 3. The method may be considered to be for handling a buffer reset. The transmitting device 101 operates in the communications network 100.

In some embodiments all the actions may be performed. In some embodiments, one or more actions may be performed. One or more embodiments may be combined, where applicable. All possible combinations are not described to simplify the description. In FIG. 3, optional actions are indicated with dashed lines. Some actions may be performed in a different order than that shown in FIG. 3.

Action 301

Out of sync conditions between an UL compressor, e.g., the transmitting device 101, and a decompressor, the receiving device 102, may happen when data compression is used in the course of communications in the communications network 100. The checksum may be used by the receiving device 102 to detect UL compression memory out of sync conditions between the transmitting device 101 and the receiving device 102. After the discovery of an out of sync condition, the receiving device 102 may to notify the transmitting device 101. For example, the receiving device 102, e.g., an eNB, may detect a checksum failure, and may indicate to the transmitting device 101 to perform a buffer reset. This may be performed by sending a Radio Resource Control (RRC) Reconfiguration to the transmitting device 101.

In this Action 301, the transmitting device 101 performs a reset on a buffer of the transmitting device 101. This may be performed by the transmitting device 101, e.g., a UE, e.g., after receiving the RRC Reconfiguration from the receiving device 102, which may trigger the transmitting device 101 to reset/refresh the associated buffer.

The buffer may be a buffer for a, or associated with, an uplink data compression feature, such as e.g., UDC in LTE.

By performing this Action 301, the transmitting device 101 may flush out the current content of the buffer and, may then be able to reinitialize the buffer content with a predefined initial value or with all Zeros or Null values.

Action 302

In this Action 302, the transmitting device 101 switches, based on the performed reset, a first value in an indication to a second value. The indication is of the reset of the buffer. The transmitting device 101 also sets the indication to the second value for all packets generated by the transmitting device 101 after the performed reset, until the second value is switched again by the transmitting device 101 in another indication, based on another performed reset of the buffer.

Switching may be also understood as toggling.

Switched again may be understood to be from the second value to the first value.

The another indication, may be understood as being the same as the indication, but sent by the transmitting device 101 at another time.

The indication may be a field of a UDC header in a Protocol Data Unit (PDU). The header may be e.g., the header depicted later, in FIG. 4, in Octet 3 (Oct 3). Any of the first value and the second value may be e.g., 1 bit, 0 or 1, or two bits, any combination of 0 and 1. The first value may be understood to be different from the second value. The indication as a field of the UDC header in the PDU will now be explained in further detail.

A header comprising information about an enabled uplink data compression feature of one or more data PDUs, may be understood to be part of a Packet Data Convergence Protocol (PDCP) header when the uplink data compression feature is configured. For example, a UDC header, e.g., 1 byte, may be understood to be part of a PDCP header when UDC is configured. UDC may be used here as an illustrative example of an uplink data compression feature. The established UDC context may be understood to contain a memory buffer on the transmitting device 101 and on the receiving device 102 side. The transmitting device 101, also referred to herein as the compressor, may compress data and send it to the receiving device 102, also referred to herein as the decompressor, along with the UDC header. Alternatively, the checksum may be a part of the PDCP header [5], as shown in the non-limiting example of FIG. 4, which shows a packet format with a UDC header in the third Octet (Oct 3).

It has been agreed that one bit from the octet, that is, the UDC header, may be used to specify whether the packet is compressed or uncompressed by the UDC algorithm. This one bit may be referred to as a Field UDC (FU) field, as described next.

FU Field:

This field may be considered to be an indicator of whether this packet, that is, the packet bearing the field, is processed by the UDC entity or not. For example, "1" may mean that this packet is processed by UDC and the content following this 1 byte header is a UDC data block [4], as illustrated by the following Table 1.

TABLE 1

| Bit | Description |
|---|---|
| 0 | Packet Not Processed Using UDC |
| 1 | Packet Processed Using UDC |

According to one of the embodiments herein, an indication, e.g., one bit, in the PDCP/UDC header may be used to indicate whether the packet has been generated before or after the reset of the buffer the transmitting device 101 has performed. According to Action 302, this indication, e.g., bit, may be toggled by the transmitting device 101, e.g., a UE, e.g., after receiving a Radio Resource Control (RRC) Reconfiguration from the receiving device 102, which may trigger the transmitting device 101 to reset/refresh the associated buffer. To toggle may be understood herein to mean that the value of the indication is changed from a first value to a second value, e.g., if the indication initially is 0 and then the buffer is reset, the indication may be set to 1, and if another reset is done the indication may be set to 0. To toggle may also be described herein as to switch. In the example presented so far, the indication is one bit and hence may only take two values. However it may be possible to apply embodiments herein also to a case when the indication may take more than two values. For example, when a reset is performed, the indication may change from 0 (or 00 binary) to 1 (or 01 binary), and change from 1 (01) to 2 (10), and from 2 (10) to 3 (11), and from 3 (11) to 0 (00). One of the reserved bits 407, 408 or 409 in the PDCP/UDC header may be used as the first indication.

Action 303

In this Action 303, the transmitting device 101 sends the indication with the second value to the receiving device 102 operating in the communications network 100. The second value indicates that the reset was performed by the transmitting device 101.

Sending may also be understood as transmitting. The sending in this Action 303 may be performed e.g., via the link 140.

By sending the indication to the receiving device 102 in this Action 303, the transmitting device 101 enables the receiving device 102 may be enabled to know whether the packet was processed by the UDC algorithm before or after the buffer was reset. This in turn may enable the receiving device 102, e.g., the PDCP in the receiving device 102, to use this information to determine whether to discard this packet or whether to use this packet, for example, whether the PDCP layer should forward the packet to an upper layer.

Action 304

At the time of performing the reset of the buffer in Action 301, the transmitting device 101 may have had packets in its buffer that may have not yet been transmitted to the receiving device 102. Some of these packets may have already been compressed, whereas others may have not yet been compressed. After performing the reset of the buffer in Action 301, the transmitting device 101 may then need to reprocess these packets. In some embodiment, the transmitting device 101, e.g., the UE, may reprocess packets in the buffer upon resetting an UDC algorithm/buffer, as described in Action 304 and Action 305. This may be achieved by first decompressing the packets and then compressing them again, but using a reset/refreshed buffer, as in this Action 304.

In this Action 304, the transmitting device 101 may decompress one or more first packets generated before performing the reset of the buffer in Action 301, and at least one of: a) not yet sent to the receiving device 102, and b) not yet submitted to lower layers.

By, in this Action 304, decompressing the one or more first packets generated before performing the buffer reset, the transmitting device 101 may reconstruct the original packet which may be again compressed using the correct UDC buffer content.

Action 305

Alternatively or additionally to performing Action 304, the transmitting device 101 may keep an uncompressed copy of each packet, for a certain time duration, in which case the transmitting device 101 may not need to decompress the packets, as in this Action 305. In this Action 305, the transmitting device 101 may compress an uncompressed copy of the one or more first packets generated before performing the reset of the buffer in Action 301, and at least one of: a) not yet sent to the receiving device 102 and b) not yet submitted to lower layers.

In one version of this embodiment, the transmitting device 101 may only perform the reprocessing for those packets which have yet not been transmitted to lower layers, that is, below PDCP. While this may increase the processing load of the transmitting device 101, since at the reset the transmitting device 101 may need to process many packets which already were processed before, that is, prior to the reset, only those packets which have not been transmitted to lower layer may need to be reprocessed.

Any of the decompressing in this Action 304 and the compressing in Action 305 may be performed based on an uplink data compression feature such as UDC.

By, in this Action 305, compressing the uncompressed copy of the one or more first packets generated before performing the reset, the transmitting device 101 may enable the receiving device 102 to decompress the packets without any error.

Action 306

After the one or more first packets and the uncompressed copy of the one or more first packets, which may have been in the buffer at the time the reset may have been performed, may have been processed according to any of Action 304 and Action 305, the transmitting device 101 may be ready to send the reprocessed packets to the receiving device 102. Accordingly, in this Action 306, the transmitting device 101 may send one or more packets to the receiving device 102. The one or more packets may comprise at least one of: i) one or more second packets, and ii) one or more third packets, based on one of: a) the decompressed one or more first packets, that is packets reprocessed according to Action 304, and b) the compressed, uncompressed copy of the one or more first packets, that is the copy reprocessed according to Action 305.

The sending in this Action 306 may be performed with, e.g., after, at least one of the decompressing in Action 304 and the compressing in Action 305.

The sending in this Action 306 may be performed e.g., via the link 140.

Figure 4:
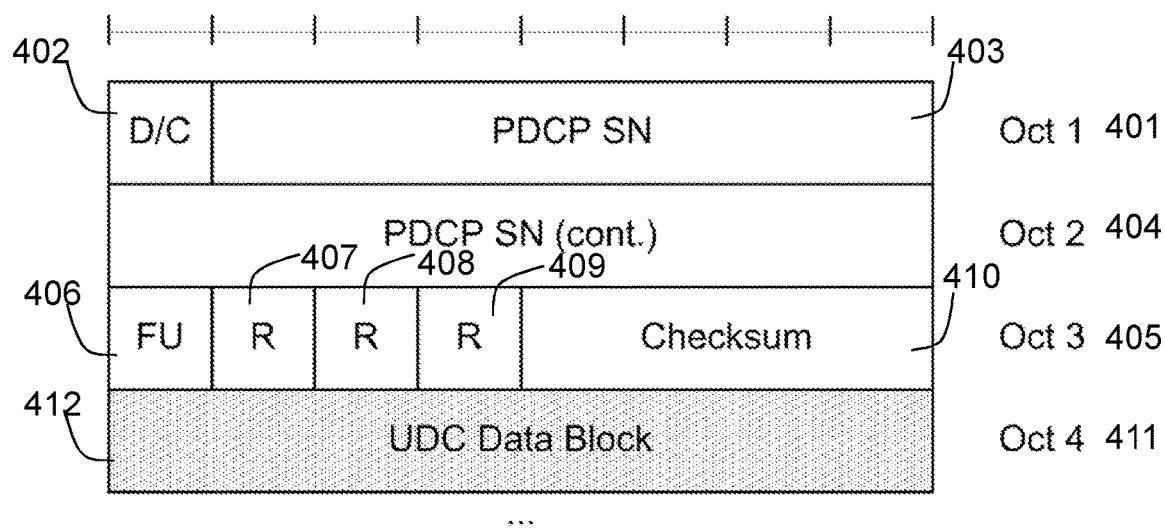
FIG. 4 is a schematic diagram illustrating an example of a packet format, according to embodiments herein.

FIG. 4 is a schematic diagram illustrating an example of a packet format, according to embodiments herein. The packet format represented in the non-limiting example of FIG. 4, the packet comprises a first octet (Oct 1) 401 that may be comprised in a packet that may be sent by the transmitting device 101. In the depicted example, the packet comprises the D/C field 402, and PDCP Sequence Number (SN) in an adjacent field 403, which is continued (cont.) in a second octet (Oct 2) 404 of the packet. The PDCP SN may indicate the sequence number of the PDCP packet. A third Octet (Oct 3) 405 comprises the UDC header [5]. The UDC header, in the non-limiting example of FIG. 4, comprises the FU field 406 described earlier, a first reserved (R) field 407, a second R filed 408, a third R field 409, and the checksum 410. A fourth octet (Oct 4) 411 comprises a UDC data block 412.

Figure 5:
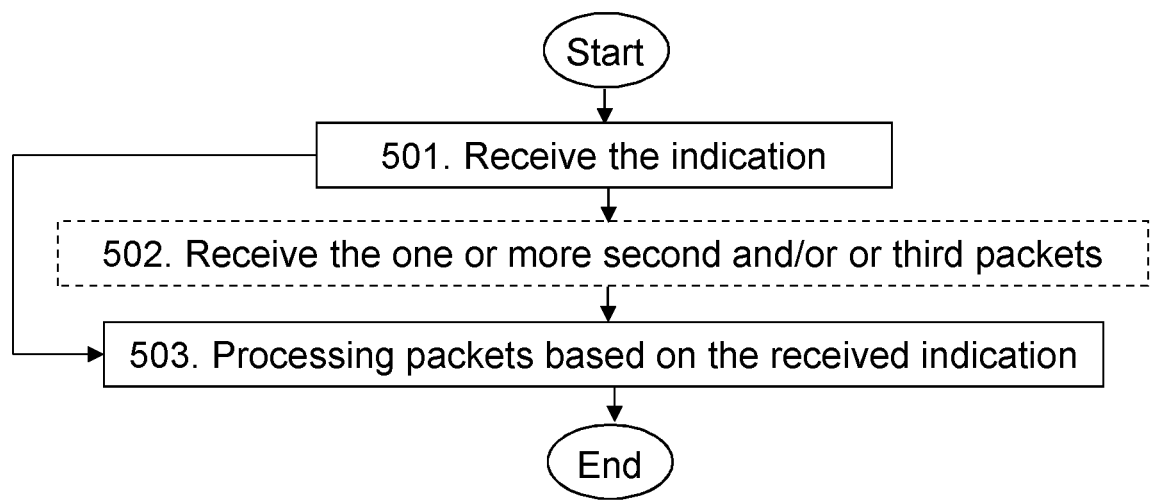
FIG. 5 is a flowchart depicting a method in a receiving device, according to embodiments herein.

Embodiments of a method, performed by the receiving device 102, will now be described with reference to the flowchart depicted in FIG. 5. The method may be considered to be handling uplink data compression. The receiving device 102 operates in the communications network 100.

In some embodiments all the actions may be performed. One or more embodiments may be combined, where applicable. All possible combinations are not described to simplify the description. In FIG. 5, an optional action is indicated with dashed lines. Some actions may be performed in a different order than that shown in FIG. 5.

The detailed description of some of the following corresponds to the same references provided above, in relation to the actions described for the transmitting device 101, and will thus not be repeated here to simplify the description, however, it may be understood to equally apply. For example, the uplink data compression feature may be e.g., UDC in LTE.

Action 501

As explained earlier, the receiving device 102 may to notify the transmitting device 101 after the discovery of an out of sync condition. For example, after the receiving device 102, e.g., an eNB, may detect a checksum failure, the RRC Reconfigure may be sent to the transmitting device 101, e.g., a UE, to trigger the transmitting device 101 to reset the buffer.

In this Action 501, the receiving device 102 receives the indication with the second value from the transmitting device 101 operating in the communications network 100. The second value indicates that the reset on the buffer of the transmitting device 101 was performed by the transmitting device 101. The indication is set to the second value for all packets generated by the transmitting device 101 after the performed reset, until another indication with the second value switched is received from the transmitting device 101, based on another performed reset of the buffer.

As described earlier, the indication may be for example one bit, or more bits. The indication may be the field of the UDC header in a PDU. The header may be e.g., the header depicted in FIG. 4, in Octet 3 (Oct 3).

The receiving in this Action 501 may be performed, e.g., via the link 140.

Another indication with the second value switched, may be understood to be equivalent to the another indication with the first value.

Depending upon the value indicated by this indication, which may also be referred to herein as a "Toggle bit", the receiving device 102 may be enabled to know whether the packet was processed by the UDC algorithm before or after the buffer was reset. The receiving device 102 may thereby be enabled to use this information to determine whether to discard this packet or whether to use this packet, for example, whether the PDCP layer should forward the packet to an upper layer.

After every reset on the transmitting device 101 side, the transmitting device 101 may toggle this bit. Until the bit is toggled, the receiving device 102 may assume that the incoming packets are still processed by out of sync buffer or the packets are before the reset; so, the packets may be discarded by the receiving device 102. Once a packet with a bit reset/toggled is received by the receiving device 102, the packets may be then processed by receiving device 102. Or, as discussed below, decompressed using the correct buffer.

Action 502

In some embodiments, the receiving device 102 may, in this Action 502, receive, from the transmitting device 101, the one or more packets described in Action 306. The one or more packets may comprise one or more of: i) the one or more second packets, and ii) the one or more third packets. The one or more third packets may be based on one of: a) the decompressed one or more first packets, and b) the compressed, uncompressed copy of the one or more first packets. The decompressed one or more first packets may be understood to have been generated before the reset of the buffer having been performed, and at least one of: 1) not yet sent to the receiving device 102, and 2) not yet submitted to lower layers. The compressed, uncompressed copy of the one or more first packets may be understood to have been generated before the reset of the buffer having been performed and at least one of: a) not yet sent to the receiving device 102, and b) not yet submitted to lower layers.

The receiving in this Action 502 may be performed e.g., via the link 140.

Action 503

In this Action 503, the receiving device 102 processes, based on the received indication, the one or more packets received from the transmitting device 101.

The one or more packets may comprise one or more of: i) the one or more second packets, and ii) the one or more third packets based on one of: a) the decompressed one or more first packets and b) the compressed, uncompressed copy of the one or more first packets.

It may be understood that the one or more packets are received from the transmitting device 101 after having received the indication. The indication may be received after the receiving device 102 may have detected a checksum failure, and notified the transmitting device 101 to perform a buffer reset. Alternatively, for scenarios where the checksum may be a success, but where there may be some other UDC errors which may require a reset, for instance, the transmitting device 101 pointing to out of memory location to the receiving device 102 for decompressing the packet, the receiving device 102 may, in some examples of Action 503, decompress a packet using the buffer that may have been built based on packets received prior to the reset, if the receiving device 102 determines that the transmitting device 101 has compressed the packet before the transmitting device 101 may have reset the buffer. While, if the receiving device 102 determines that the packet was compressed after the buffer reset, the packets may be decompressed by the receiving device 102 with a reset buffer. Or in other words, the receiving device 102 may maintain one buffer which is built up by packets associated to compression prior to the reset, while maintaining another buffer built up by packets associated to compression after the reset, and depending on which of these buffers a certain packet is associated with, the receiving device 102 may decompress using the correct buffer.

By processing the one or more packets based on the received indication, the receiving device 102 may be enabled to process the packets using the correct buffer, so that the decompression may be successful, without any, or fewer, errors.

Figure 6:
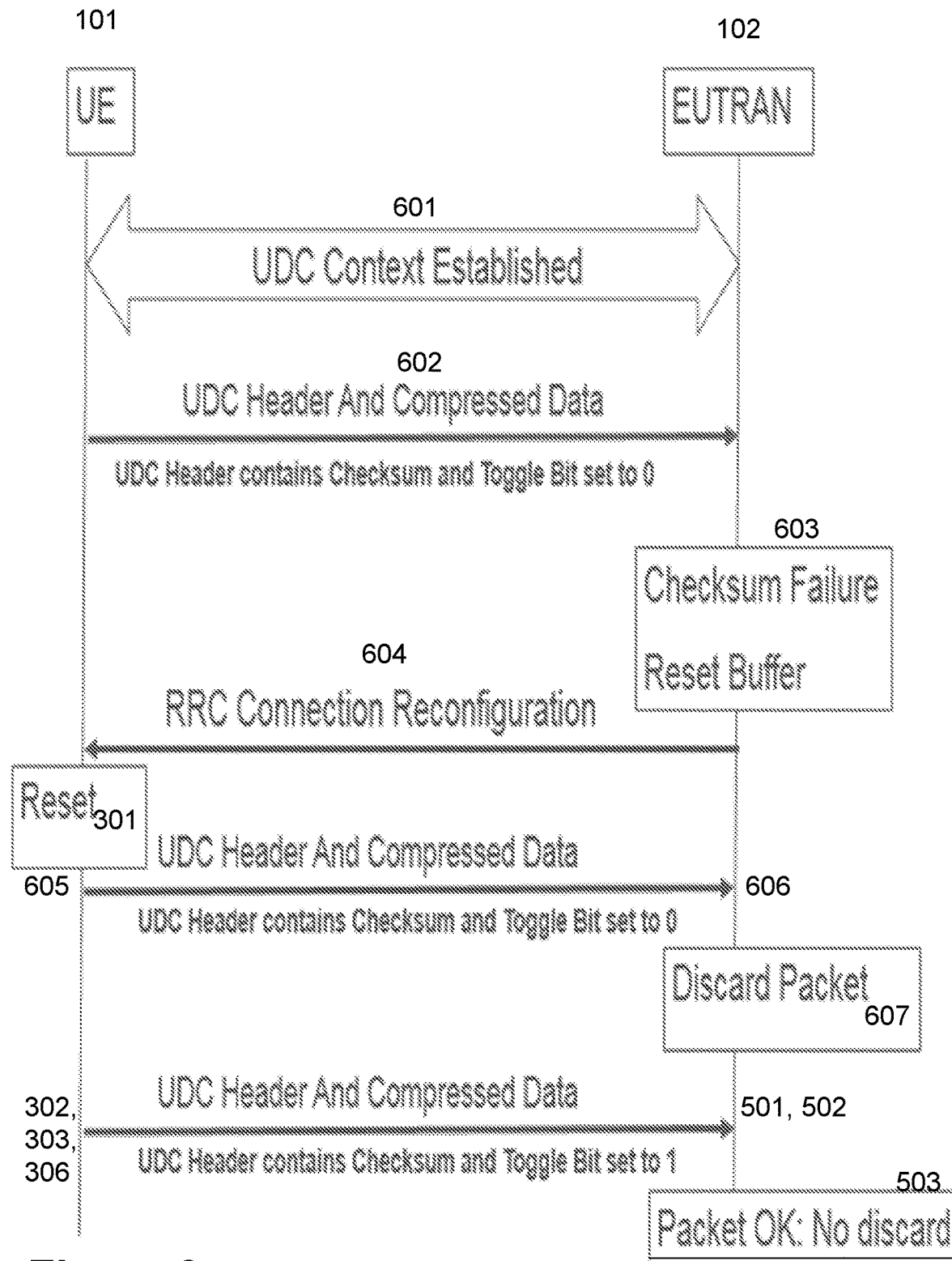
FIG. 6 is a schematic diagram illustrating an example of methods in a transmitting device and a receiving device, according to embodiments herein.

FIG. 6 depicts a non-limiting example of embodiments herein, wherein the receiving device 102, in this example a EUTRAN e-NB performs a reset of the buffer when a checksum failure is detected. At 601, a UDC context is established between the transmitting device 101, here a UE, and the receiving device 102. At 602, the transmitting device 101 sends compressed data with the UDC header to the receiving device 102. The UDC header, as e.g., depicted in FIG. 4, comprises the checksum, and the toggle bit set to 0. At 603, the receiving device 102 performs a reset of the buffer when a checksum failure is detected. At 604, the receiving device 102 sends an RRC connection reconfiguration message to the transmitting device 101, triggering the reset of the buffer at the transmitting device 101. In accordance with Action 301, the transmitting device 101 then performs a buffer reset. At 605, the transmitting device 101 sends compressed data to the receiving device 102 with a UDC header. These are some packets that were in the buffer of the transmitting device 101, just before the reset took place. The header comprises the checksum and the toggle bit is not yet toggled. Therefore it still has the first value of "0". When the packet is received by the receiving device 102 at 606, the receiving device 102 processes the one or more packets received from the transmitting device 101 based on the received indication and discards the packets received at 607, since the toggle bit from 602 has not been changed from "0" yet. This indicates to the receiving device 102 that the incoming packets are still processed by the out of sync buffer or the packets are before the reset; so, the packets may be discarded by the receiving device 102 At 302, the transmitting device 101 switches, the first value in the indication to the second value, and sends the indication in the UDC header with the second value at 302, and the one or more packets to the receiving device 102 at 306. The one or more packets comprise compressed data. The UDC header comprises the checksum and the indication, the toggle bit, set to 1. At 501, the receiving device 102 receives the indication with the second value, and the one or more packets, as described in Action 502. At 503, the receiving device 102 processes the one or more packets received from the transmitting device 101 based on the received indication and refrains from discarding the packets received onwards, as it knows that they have been sent after the buffer reset has been performed.

Figure 7:
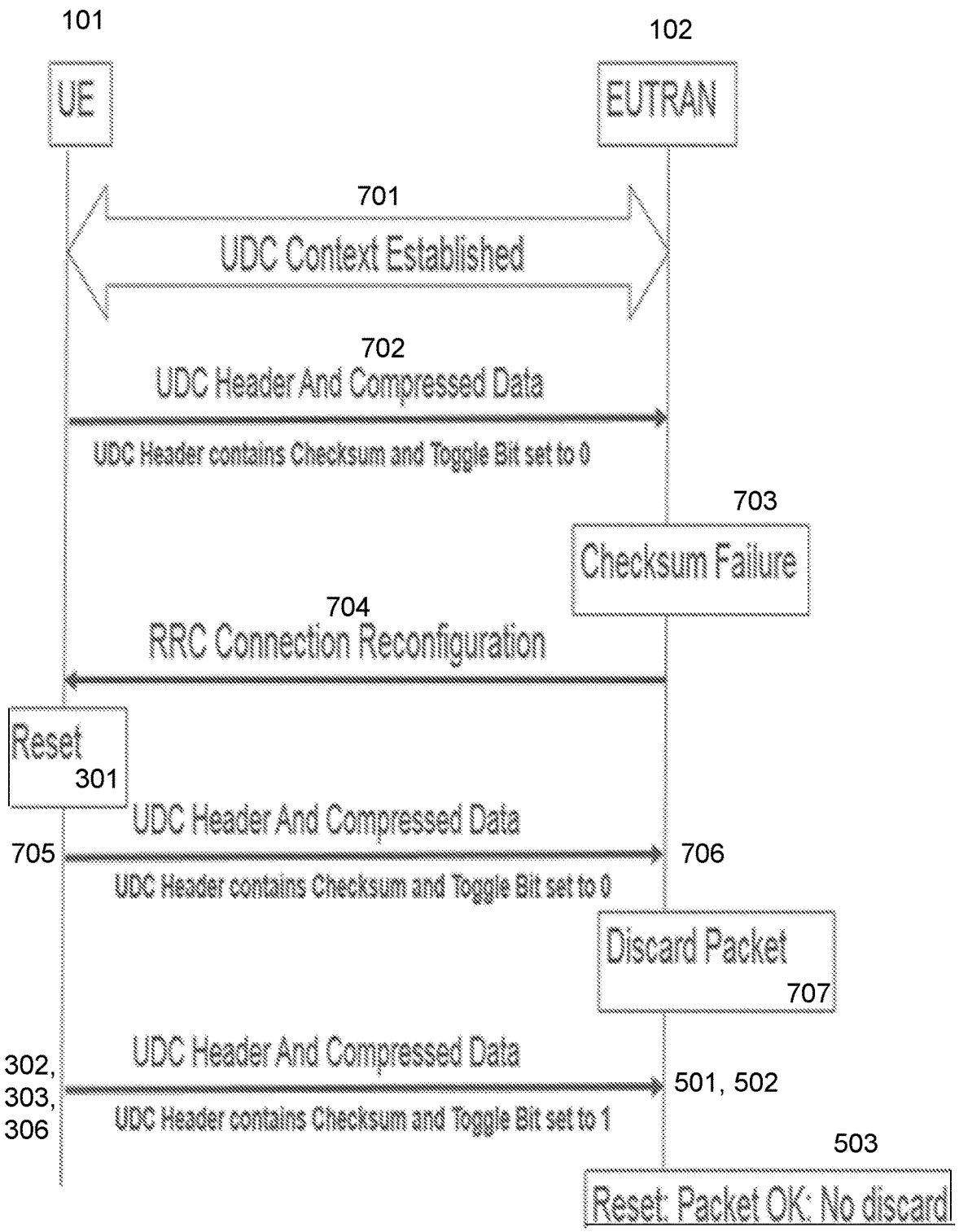
FIG. 7 is a schematic diagram illustrating another example of methods in a transmitting device and a receiving device, according to embodiments herein.

FIG. 7 depicts another non-limiting example of embodiments herein, wherein the receiving device 102, in this example a EUTRAN e-NB may perform the reset after receiving the toggled bit. The description of action 701 and 702 corresponds, respectively to that provided in FIG. 6 for actions 601 and 602. At 703, the receiving device 102 detects a checksum failure. At 704, the receiving device 102 sends an RRC connection reconfiguration message to the transmitting device 101, triggering the reset of the buffer at the transmitting device 101. In accordance with Action 301, the transmitting device 101 then performs a buffer reset. At 705, the transmitting device 101 sends compressed data to the receiving device 102 with a UDC header. These are some packets that were in the buffer of the transmitting device 101, just before the reset took place. The header comprises the checksum and the toggle bit is not yet toggled. Therefore it still has the first value of "0". When the packets are received by the receiving device 102 at 706, the receiving device 102 processes the one or more packets received from the transmitting device 101 based on the received indication and discards the packets received at 707, since the toggle bit from 602 has not been changed from "0" yet. This indicates to the receiving device 102 that the incoming packets are still processed by the out of sync buffer or the packets are before the reset; so, the packets may be discarded by the receiving device 102 At 302, the transmitting device 101 switches, the first value in the indication to the second value, and sends the indication in the UDC header with the second value at 302, and the one or more packets to the receiving device 102 at 306. The one or more packets comprise compressed data. The UDC header comprises the checksum and the indication, the toggle bit, set to 1. At 501, the receiving device 102 receives the indication with the second value, and the one or more packets, as described in Action 502. At 503, the receiving device 102 processes the one or more packets received from the transmitting device 101 based on the received indication and refrains from discarding the packets received onwards, as it knows that they have been sent after the buffer reset has been performed.

Certain embodiments may provide one or more of the following technical advantage(s). The advantages of the embodiments herein are mainly in terms of efficiency and flexibility, which may be summarized as follows: the receiving device 102, such as an eNB, may be enabled to know if the transmitting device 101, e.g., a UE, has successfully reset the uplink data compression buffer memory. By the transmitting device 101 sending the second indication to the receiving device 102, indicating whether or not the transmitting device 101 has performed a buffer reset, the transmitting device 101 enables the receiving device 102 to know how to read the one or more data PDUs, and to know if the one or more data PDUs were sent before or after the reset. Therefore, the receiving device 102 may process the one or more data PDUs accordingly. Consequently, processing and energy resources in the communications network may be used more efficiently. As an example, the improved reliability may be particularly beneficial for LTE dual connectivity, NR non-stand alone or NR dual connectivity scenarios.

Figure 8:
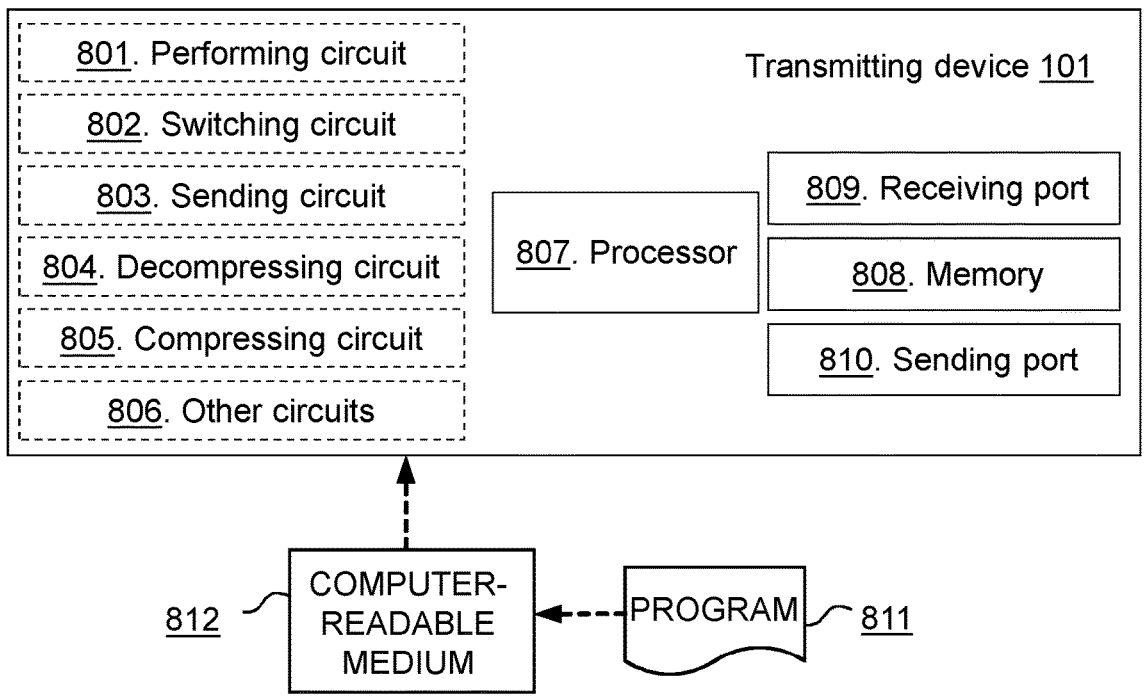
FIG. 8 is a schematic block diagram illustrating two non-limiting examples, a) and b), of a transmitting device, according to embodiments herein.
Figure 8:
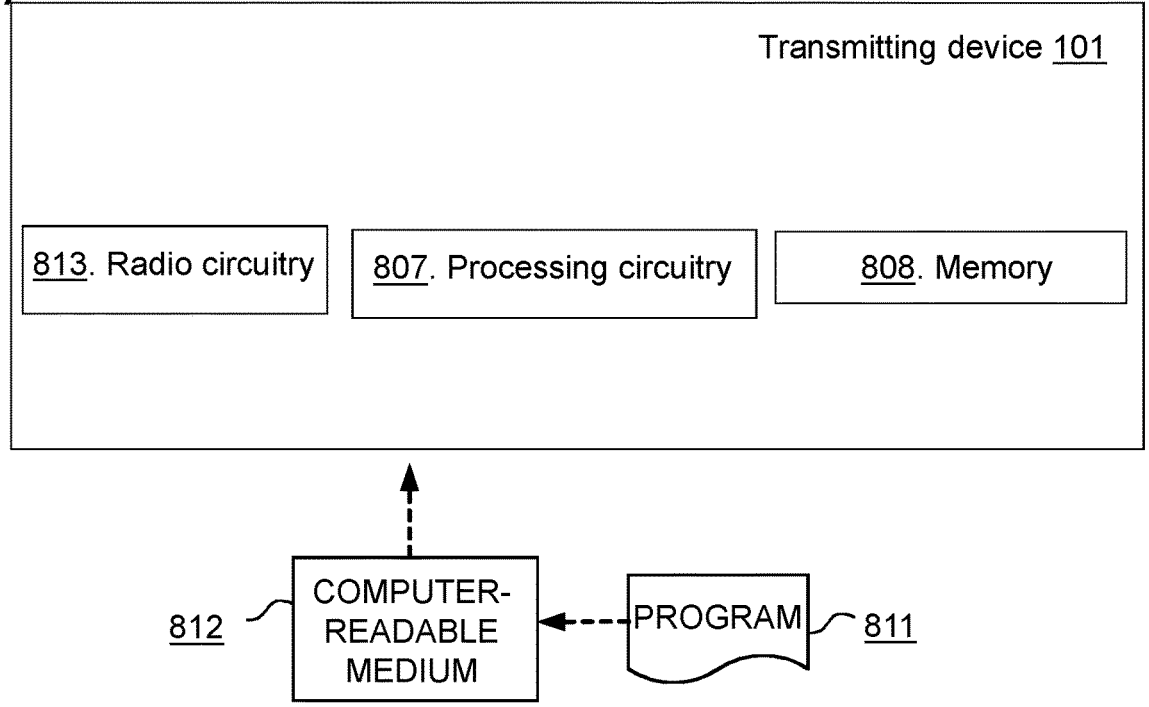

FIG. 8 depicts two different examples in panels a) and b), respectively, of the arrangement that the transmitting device 101 may comprise to perform the method actions described above in relation to FIG. 3. In some embodiments, the transmitting device 101 may comprise the following arrangement depicted in FIG. 8a. The transmitting device 101 may be configured to handle a buffer reset. The transmitting device 101 is configured to operate in the communications network 100.

Several embodiments are comprised herein. Components from one embodiment may be tacitly assumed to be present in another embodiment and it will be obvious to a person skilled in the art how those components may be used in the other exemplary embodiments. The detailed description of some of the following corresponds to the same references provided above, in relation to the actions described for the transmitting device 101, and will thus not be repeated here. For example, the uplink data compression feature may be e.g., UDC in LTE.

In FIG. 8, optional circuits are indicated with dashed boxes.

The transmitting device 101 is configured to perform the performing of Action 301, e.g., by means of a performing circuit 801 within the transmitting device 101, configured to, perform the reset on the buffer of the transmitting device 101. The performing circuit 801 may be a processor 807 of the transmitting device 101, or an application running on such processor.

The transmitting device 101 is further configured to perform the switching of Action 302, e.g., by means of a switching circuit 802 within the transmitting device 101, configured to switch, based on the reset configured to be performed, the first value in the indication to the second value. The indication is configured to be of the reset of the buffer. The transmitting device 101 is also configured to set the indication to the second value for all packets configured to be generated by the transmitting device 101 after the reset configured to be performed, until the second value is configured to be switched again by the transmitting device 101 in the another indication, based on the another reset of the buffer configured to be performed. The switching circuit 802 may be the processor 807 of the transmitting device 101, or an application running on such processor.

In some embodiments, the indication may be configured to be the field of the UDC header in a PDU.

The transmitting device 101 is further configured to perform the sending of Action 303, e.g., by means of a sending circuit 803 within the transmitting device 101, configured to send the indication with the second value to the receiving device 102 configured to operate in the communications network 100. The second value is configured to indicate that the reset was performed by the transmitting device 101. The sending circuit 803 may be the processor 807 of the transmitting device 101, or an application running on such processor.

The transmitting device 101 may be further configured to perform the decompressing of Action 304, e.g., by means of a decompressing circuit 804 within the transmitting device 101, configured to decompress the one or more first packets configured to be generated before the reset of the buffer is configured to be performed, and at least one of: a) not yet sent to the receiving device 102, and b) not yet submitted to lower layers. The decompressing circuit 804 may be the processor 807 of the transmitting device 101, or an application running on such processor.

The transmitting device 101 may further configured to perform the compressing of Action 305, e.g., by means of a compressing circuit 805 within the transmitting device 101, configured to compress the uncompressed copy of the one or more first packets configured to be generated before the reset of the buffer is configured to be performed, and at least one of: a) not yet sent to the receiving device 102 and b) not yet submitted to lower layers. The compressing circuit 805 may be the processor 807 of the transmitting device 101, or an application running on such processor.

The transmitting device 101 may be configured to perform the sending of Action 306, e.g. by means of the sending circuit 803 within the transmitting device 101, configured to send the one or more packets to the receiving device 102. The one or more packets may be configured to comprise at least one of: i) the one or more second packets, and ii) the one or more third packets based on one of: a) the one or more first packets configured to be decompressed, and b) the uncompressed copy of the one or more first packets configured to be compressed.

Other circuits 806 may be comprised in the transmitting device 101.

The embodiments herein in the transmitting device 101 may be implemented through one or more processors, such as a processor 807 in the transmitting device 101 depicted in FIG. 8, together with computer program code for performing the functions and actions of the embodiments herein. A processor, as used herein, may be understood to be a hardware component. The program code mentioned above may also be provided as a computer program product, for instance in the form of a data carrier carrying computer program code for performing the embodiments herein when being loaded into the transmitting device 101. One such carrier may be in the form of a CD ROM disc. It is however feasible with other data carriers such as a memory stick. The computer program code may furthermore be provided as pure program code on a server and downloaded to the transmitting device 101.

The transmitting device 101 may further comprise a memory 808 comprising one or more memory units. The memory 808 is arranged to be used to store obtained information, store data, configurations, schedulings, and applications etc. to perform the methods herein when being executed in the transmitting device 101.

In some embodiments, the transmitting device 101 may receive information from, e.g., the receiving device 102, through a receiving port 809. In some embodiments, the receiving port 809 may be, for example, connected to one or more antennas in the transmitting device 101. In other embodiments, the transmitting device 101 may receive information from another structure in the communications network 100 through the receiving port 809. Since the receiving port 809 may be in communication with the processor 807, the receiving port 809 may then send the received information to the processor 807. The receiving port 809 may also be configured to receive other information.

The processor 807 in the transmitting device 101 may be further configured to transmit or send information to e.g., the receiving device 102, and/or another structure in the communications network 100, through a sending port 810, which may be in communication with the processor 807, and the memory 808.

Those skilled in the art will also appreciate that the performing circuit 801, the switching circuit 802, the sending circuit 803, the decompressing circuit 804, the compressing circuit 805, and the other circuits 806 described above may refer to a combination of analog and digital circuits, and/or one or more processors configured with software and/or firmware, e.g., stored in memory, that, when executed by the one or more processors such as the processor 807, perform as described above. One or more of these processors, as well as the other digital hardware, may be included in a single Application-Specific Integrated Circuit (ASIC), or several processors and various digital hardware may be distributed among several separate components, whether individually packaged or assembled into a System-on-a-Chip (SoC).

Also, in some embodiments, the different circuits 801-806 described above may be implemented as one or more applications running on one or more processors such as the processor 807.

Thus, the methods according to the embodiments described herein for the transmitting device 101 may be respectively implemented by means of a computer program 811 product, comprising instructions, i.e., software code portions, which, when executed on at least one processor 807, cause the at least one processor 807 to carry out the actions described herein, as performed by the transmitting device 101. The computer program 811 product may be stored on a computer-readable storage medium 812. The computer-readable storage medium 812, having stored thereon the computer program 811, may comprise instructions which, when executed on at least one processor 807, cause the at least one processor 807 to carry out the actions described herein, as performed by the transmitting device 101. In some embodiments, the computer-readable storage medium 812 may be a non-transitory computer-readable storage medium, such as a CD ROM disc, or a memory stick. In other embodiments, the computer program 811 product may be stored on a carrier containing the computer program 811 just described, wherein the carrier is one of an electronic signal, optical signal, radio signal, or the computer-readable storage medium 812, as described above.

The transmitting device 101 may comprise a communication interface configured to facilitate communications between the transmitting device 101 and other nodes or devices, e.g., the receiving device 102. The interface may, for example, include a transceiver configured to transmit and receive radio signals over an air interface in accordance with a suitable standard.

In other embodiments, the transmitting device 101 may comprise the following arrangement depicted in FIG. 8b. The transmitting device 101 may comprise a processing circuitry 807, e.g., one or more processors such as the processor 807, in the transmitting device 101 and the memory 808. The transmitting device 101 may also comprise a radio circuitry 813, which may comprise e.g., the receiving port 809 and the sending port 810. The processing circuitry 807 may be configured to, or operable to, perform the method actions according to FIG. 3, FIG. 6, FIG. 7, and/or FIGS. 11-15, in a similar manner as that described in relation to FIG. 8a. The radio circuitry 813 may be configured to set up and maintain at least a wireless connection with the receiving device 102. Circuitry may be understood herein as a hardware component.

Hence, embodiments herein also relate to the transmitting device 101 operative to operate in the communications network 100. The transmitting device 101 may comprise the processing circuitry 807 and the memory 808, said memory 808 containing instructions executable by said processing circuitry 807, whereby the transmitting device 101 is further operative to perform the actions described herein in relation to the transmitting device 101, e.g., in FIG. 3, FIG. 6, FIG. 7, and/or FIGS. 11-15.

Figure 9:
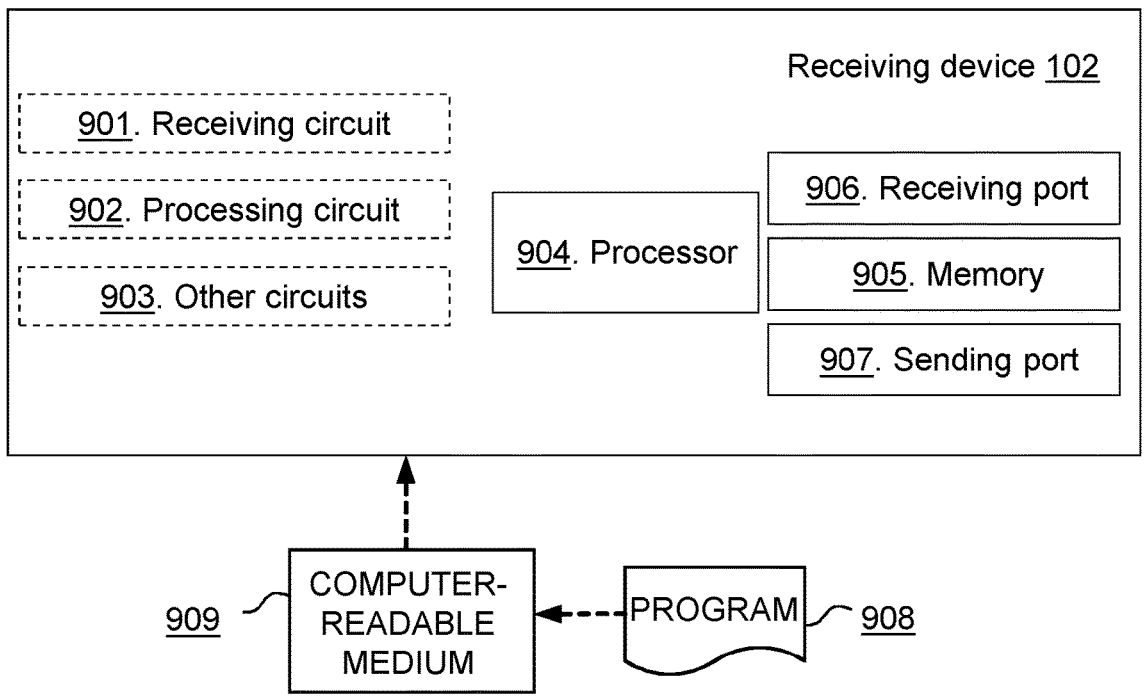
FIG. 9 is a schematic block diagram illustrating two non-limiting examples, a) and b), of a receiving device, according to embodiments herein.
Figure 9:
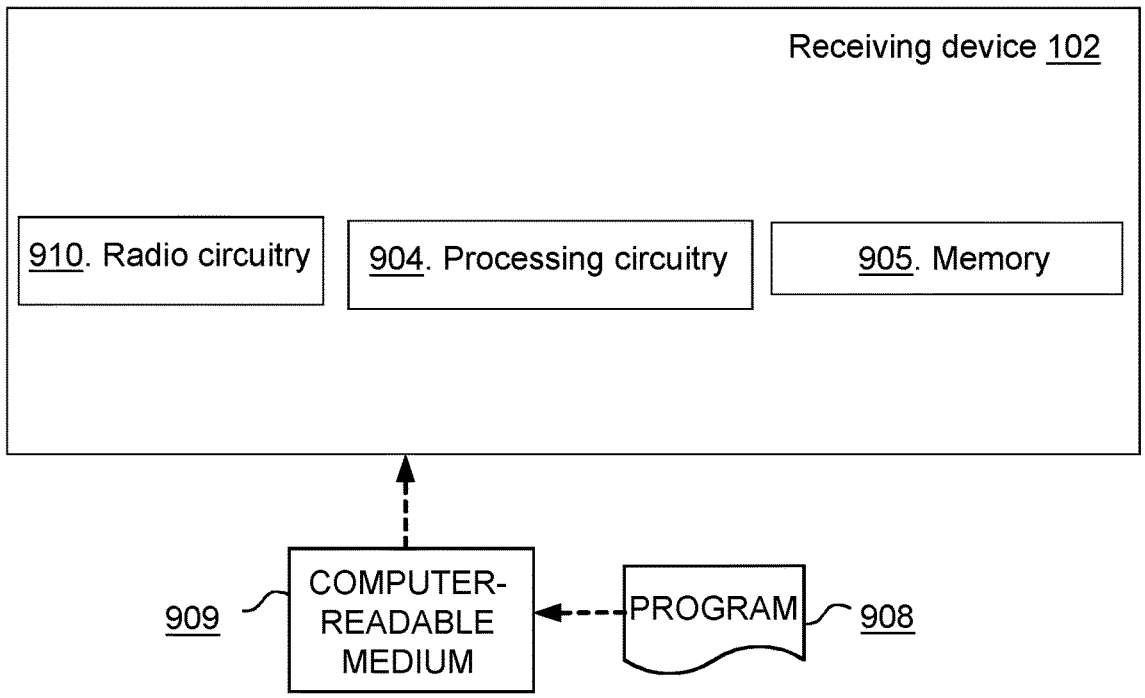

FIG. 9 depicts two different examples in panels a) and b), respectively, of the arrangement that the receiving device 102 may comprise to perform the method actions described above in relation to FIG. 5. In some embodiments, the receiving device 102 may comprise the following arrangement depicted in FIG. 9*a*. The receiving device 102 may be configured to handle a buffer reset. The receiving device 102 is configured to operate in the communications network 100.

Several embodiments are comprised herein. Components from one embodiment may be tacitly assumed to be present in another embodiment and it will be obvious to a person skilled in the art how those components may be used in the other exemplary embodiments. The detailed description of some of the following corresponds to the same references provided above, in relation to the actions described for the receiving device 102, and will thus not be repeated here. For example, the uplink data compression feature may be e.g., UDC in LTE.

In FIG. 9, optional circuits are indicated with dashed boxes.

The receiving device 102 is configured to perform the receiving of Action 501, e.g. by means of a receiving circuit 901 within the receiving device 102, configured to, receive the indication with the second value from a transmitting device 101 configured to operate in the communications network 100. The second value is configured to indicate that the reset on the buffer of the transmitting device 101 was performed by the transmitting device 101. The indication is configured to be set to the second value for all packets configured to be generated by the transmitting device 101 after the reset configured to be performed, until another indication with the second value switched is configured to be received from the transmitting device 101, based on another reset of the buffer configured to be performed. The receiving circuit 901 may be a processor 904 of the receiving device 102, or an application running on such processor.

In some embodiments, the indication may be configured to be the field of the UDC header in a PDU.

The receiving device 102 is further configured to perform the processing of Action 503, e.g. by means of a processing circuit 902 within the receiving device 102, configured to process, based on the indication configured to be received, the one or more packets configured to be received from the transmitting device 101. The processing circuit 902 may be the processor 904 of the receiving device 102, or an application running on such processor.

In some of the embodiments, the receiving device 102 may be further configured to perform the receiving of Action 502, e.g. by means of the receiving circuit 901 within the receiving device 102, configured to, receive, from the transmitting device 101, the one or more packets. The one or more packets may be further configured to comprise one or more of: i) the one or more second packets, and ii) the one or more third packets based on one of: ii.a) the decompressed one or more first packets configured to be generated before the reset of the buffer configured to have been performed, and at least one of: a) not yet sent to the receiving device 102, and b) not yet submitted to lower layers and ii.b) the compressed, uncompressed copy of the one or more first packets configured to be generated before the reset of the buffer configured to have been performed and at least one of: a) not yet sent to the receiving device 102 and b) not yet submitted to lower layers.

Other circuits 903 may be comprised in the receiving device 102.

The embodiments herein in the receiving device 102 may be implemented through one or more processors, such as a processor 904 in the receiving device 102 depicted in FIG. 9*a*, together with computer program code for performing the functions and actions of the embodiments herein. A processor, as used herein, may be understood to be a hardware component. The program code mentioned above may also be provided as a computer program product, for instance in the form of a data carrier carrying computer program code for performing the embodiments herein when being loaded into the receiving device 102. One such carrier may be in the form of a CD ROM disc. It is however feasible with other data carriers such as a memory stick. The computer program code may furthermore be provided as pure program code on a server and downloaded to the receiving device 102.

The receiving device 102 may further comprise a memory 905 comprising one or more memory units. The memory 905 is arranged to be used to store obtained information, store data, configurations, schedulings, and applications etc. to perform the methods herein when being executed in the receiving device 102.

In some embodiments, the receiving device 102 may receive information from, e.g., the transmitting device 101, through a receiving port 906. In some embodiments, the receiving port 906 may be, for example, connected to one or more antennas in receiving device 102. In other embodiments, the receiving device 102 may receive information from another structure in the communications network 100 through the receiving port 906. Since the receiving port 906 may be in communication with the processor 904, the receiving port 906 may then send the received information to the processor 904. The receiving port 906 may also be configured to receive other information.

The processor 904 in the receiving device 102 may be further configured to transmit or send information to e.g., the transmitting device 101, and/or another structure in the communications network 100, through a sending port 907, which may be in communication with the processor 904, and the memory 905.

Those skilled in the art will also appreciate that the receiving circuit 901, the processing circuit 902, and the other circuits 903 described above may refer to a combination of analog and digital circuits, and/or one or more processors configured with software and/or firmware, e.g., stored in memory, that, when executed by the one or more processors such as the processor 904, perform as described above. One or more of these processors, as well as the other digital hardware, may be included in a single Application-Specific Integrated Circuit (ASIC), or several processors and various digital hardware may be distributed among several separate components, whether individually packaged or assembled into a System-on-a-Chip (SoC).

Also, in some embodiments, the different circuits 901-903 described above may be implemented as one or more applications running on one or more processors such as the processor 904.

Thus, the methods according to the embodiments described herein for the receiving device 102 may be respectively implemented by means of a computer program 908 product, comprising instructions, i.e., software code portions, which, when executed on at least one processor 904, cause the at least one processor 904 to carry out the actions described herein, as performed by the receiving device 102. The computer program 908 product may be stored on a computer-readable storage medium 909. The computer-readable storage medium 909, having stored thereon the computer program 908, may comprise instructions which, when executed on at least one processor 904, cause the at least one processor 904 to carry out the actions described herein, as performed by the receiving device 102. In some embodiments, the computer-readable storage medium 909 may be a non-transitory computer-readable storage medium, such as a CD ROM disc, or a memory stick. In other embodiments, the computer program 908 product may be stored on a carrier containing the computer program 908 just described, wherein the carrier is one of an electronic signal, optical signal, radio signal, or the computer-readable storage medium 909, as described above.

The receiving device 102 may comprise a communication interface configured to facilitate communications between the receiving device 102 and other nodes or devices, e.g., the transmitting device 101. The interface may, for example, include a transceiver configured to transmit and receive radio signals over an air interface in accordance with a suitable standard.

In other embodiments, the receiving device 102 may comprise the following arrangement depicted in FIG. 9b. The receiving device 102 may comprise a processing circuitry 904, e.g., one or more processors such as the processor 904, in the receiving device 102 and the memory 905. The receiving device 102 may also comprise a radio circuitry 910, which may comprise e.g., the receiving port 906 and the sending port 907. The processing circuitry 910 may be configured to, or operable to, perform the method actions according to FIG. 5, FIG. 6, FIG. 7, and/or 11-15, in a similar manner as that described in relation to FIG. 9a. The radio circuitry 910 may be configured to set up and maintain at least a wireless connection with the transmitting device 101. Circuitry may be understood herein as a hardware component.

Hence, embodiments herein also relate to the receiving device 102 operative to operate in the communications network 100. The receiving device 102 may comprise the processing circuitry 904 and the memory 905, said memory 905 containing instructions executable by said processing circuitry 904, whereby the receiving device 102 is further operative to perform the actions described herein in relation to the receiving device 102, e.g., in FIG. 5, FIG. 6, FIG. 7, and/or 11-15.

As used herein, the expression "at least one of:" followed by a list of alternatives separated by commas, and wherein the last alternative is preceded by the "and" term, may be understood to mean that only one of the list of alternatives may apply, more than one of the list of alternatives may apply or all of the list of alternatives may apply. This expression may be understood to be equivalent to the expression "at least one of:" followed by a list of alternatives separated by commas, and wherein the last alternative is preceded by the "or" term.

Further Extensions and Variations

Figure 10:
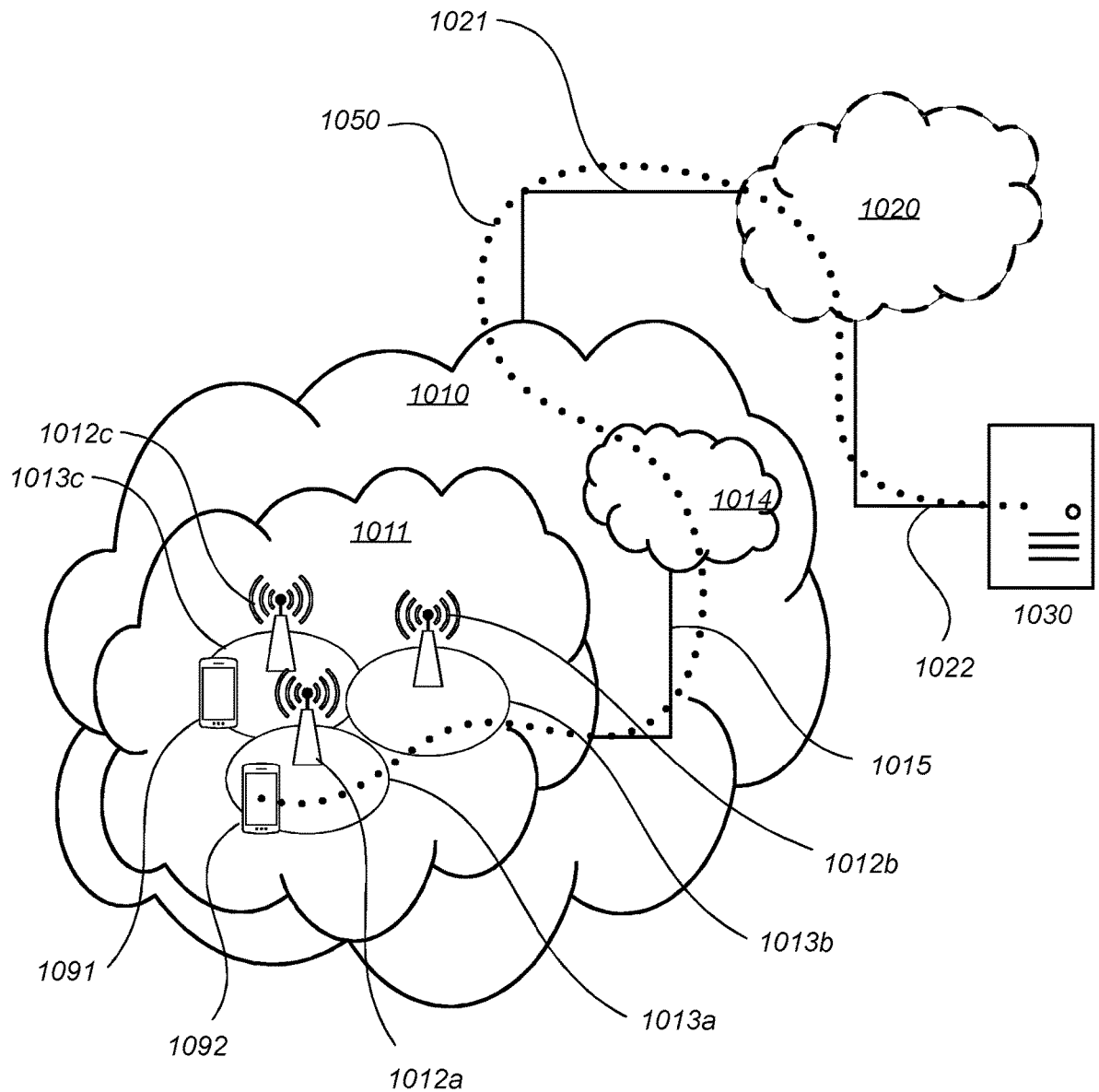
FIG. 10 is a schematic block diagram illustrating a telecommunication network connected via an intermediate network to a host computer, according to embodiments herein.

FIG. 10: Telecommunication Network Connected Via an Intermediate Network to a Host Computer in Accordance with Some Embodiments With reference to FIG. 10, in accordance with an embodiment, a communication system includes telecommunication network 1010 such as the communications network 100, for example, a 3GPP-type cellular network, which comprises access network 1011, such as a radio access network, and core network 1014. Access network 1011 comprises a plurality of network nodes such as the network node 110. For example, base stations 1012a, 1012b, 1012c, such as NBs, eNBs, gNBs or other types of wireless access points, each defining a corresponding coverage area 1013a, 1013b, 1013c. Each base station 1012a, 1012b, 1012c is connectable to core network 1014 over a wired or wireless connection 1015. A plurality of wireless devices, such as the wireless device 130 are comprised in the communications network 100. In FIG. 10, a first UE 1091 located in coverage area 1013c is configured to wirelessly connect to, or be paged by, the corresponding base station 1012c. A second UE 1092 in coverage area 1013a is wirelessly connectable to the corresponding base station 1012a. While a plurality of UEs 1091, 1092 are illustrated in this example, the disclosed embodiments are equally applicable to a situation where a sole UE is in the coverage area or where a sole UE is connecting to the corresponding base station 1012. Any of the UEs 1091, 1092 are examples of the wireless device 130.

Telecommunication network 1010 is itself connected to host computer 1030, which may be embodied in the hardware and/or software of a standalone server, a cloud-implemented server, a distributed server or as processing resources in a server farm. Host computer 1030 may be under the ownership or control of a service provider, or may be operated by the service provider or on behalf of the service provider. Connections 1021 and 1022 between telecommunication network 1010 and host computer 1030 may extend directly from core network 1014 to host computer 1030 or may go via an optional intermediate network 1020. Intermediate network 1020 may be one of, or a combination of more than one of, a public, private or hosted network; intermediate network 1020, if any, may be a backbone network or the Internet; in particular, intermediate network 1020 may comprise two or more sub-networks (not shown).

The communication system of FIG. 10 as a whole enables connectivity between the connected UEs 1091, 1092 and host computer 1030. The connectivity may be described as an over-the-top (OTT) connection 1050. Host computer 1030 and the connected UEs 1091, 1092 are configured to communicate data and/or signaling via OTT connection 1050, using access network 1011, core network 1014, any intermediate network 1020 and possible further infrastructure (not shown) as intermediaries. OTT connection 1050 may be transparent in the sense that the participating communication devices through which OTT connection 1050 passes are unaware of routing of uplink and downlink communications. For example, base station 1012 may not or need not be informed about the past routing of an incoming downlink communication with data originating from host computer 1030 to be forwarded (e.g., handed over) to a connected UE 1091. Similarly, base station 1012 need not be aware of the future routing of an outgoing uplink communication originating from the UE 1091 towards the host computer 1030.

In relation to FIGS. 11, 12, 13, 14, and 15, which are described next, it may be understood that a UE is an example of the transmitting device 101, and that any description provided for the UE equally applies to the transmitting device 101. It may be also understood that the base station is an example of the receiving device 102, and that any description provided for the base station equally applies to the receiving device 102.

Figure 11:
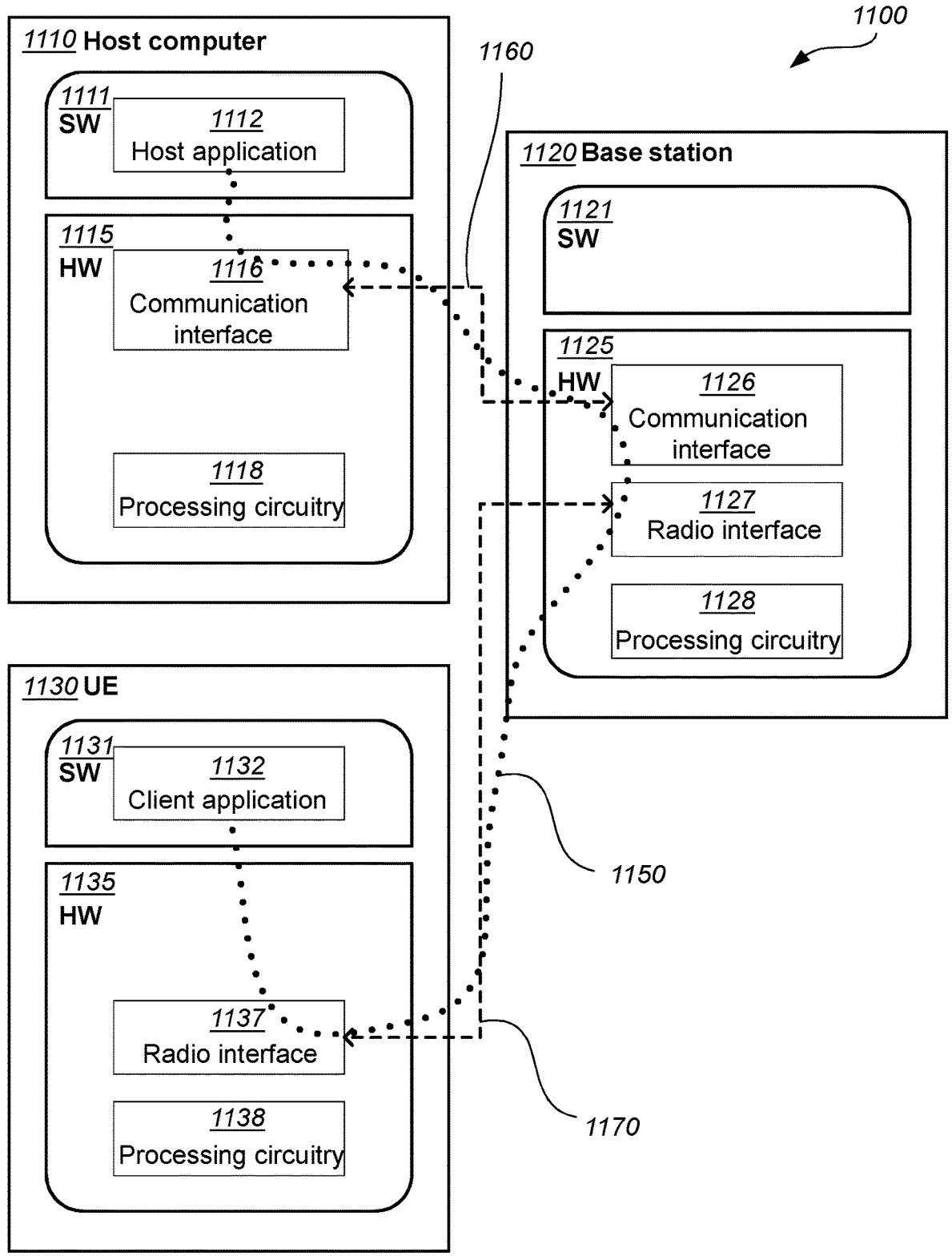
FIG. 11 is a generalized block diagram of a host computer communicating via a base station with a user equipment over a partially wireless connection, according to embodiments herein.

FIG. 11: Host Computer Communicating Via a Base Station with a User Equipment Over a Partially Wireless Connection in Accordance with Some Embodiments Example implementations, in accordance with an embodiment, of the transmitting device 101, e.g., a UE, the receiving device 102, e.g., a base station and host computer discussed in the preceding paragraphs will now be described with reference to FIG. 11. In communication system 1100, such as the communications network 100, host computer 1110 comprises hardware 1115 including communication interface 1116 configured to set up and maintain a wired or wireless connection with an interface of a different communication device of communication system 1100. Host computer 1110 further comprises processing circuitry 1118, which may have storage and/or processing capabilities. In particular, processing circuitry 1118 may comprise one or more programmable processors, application-specific integrated circuits, field programmable gate arrays or combinations of these (not shown) adapted to execute instructions. Host computer 1110 further comprises software 1111, which is stored in or accessible by host computer 1110 and executable by processing circuitry 1118. Software 1111 includes host application 1112. Host application 1112 may be operable to provide a service to a remote user, such as UE 1130 connecting via OTT connection 1150 terminating at UE 1130 and host computer 1110. In providing the service to the remote user, host application 1112 may provide user data which is transmitted using OTT connection 1150.

Communication system 1100 further includes the receiving device 102, exemplified in FIG. 11 as a base station 1120 provided in a telecommunication system and comprising hardware 1125 enabling it to communicate with host computer 1110 and with UE 1130. Hardware 1125 may include communication interface 1126 for setting up and maintaining a wired or wireless connection with an interface of a different communication device of communication system 1100, as well as radio interface 1127 for setting up and maintaining at least wireless connection 1170 with the transmitting device 101, exemplified in FIG. 11 as a UE 1130 located in a coverage area (not shown in FIG. 11) served by base station 1120. Communication interface 1126 may be configured to facilitate connection 1160 to host computer 1110. Connection 1160 may be direct or it may pass through a core network (not shown in FIG. 11) of the telecommunication system and/or through one or more intermediate networks outside the telecommunication system. In the embodiment shown, hardware 1125 of base station 1120 further includes processing circuitry 1128, which may comprise one or more programmable processors, application-specific integrated circuits, field programmable gate arrays or combinations of these (not shown) adapted to execute instructions. Base station 1120 further has software 1121 stored internally or accessible via an external connection.

Communication system 1100 further includes UE 1130 already referred to. Its hardware 1135 may include radio interface 1137 configured to set up and maintain wireless connection 1170 with a base station serving a coverage area in which UE 1130 is currently located. Hardware 1135 of UE 1130 further includes processing circuitry 1138, which may comprise one or more programmable processors, application-specific integrated circuits, field programmable gate arrays or combinations of these (not shown) adapted to execute instructions. UE 1130 further comprises software 1131, which is stored in or accessible by UE 1130 and executable by processing circuitry 1138. Software 1131 includes client application 1132. Client application 1132 may be operable to provide a service to a human or non-human user via UE 1130, with the support of host computer 1110. In host computer 1110, an executing host application 1112 may communicate with the executing client application 1132 via OTT connection 1150 terminating at UE 1130 and host computer 1110. In providing the service to the user, client application 1132 may receive request data from host application 1112 and provide user data in response to the request data. OTT connection 1150 may transfer both the request data and the user data. Client application 1132 may interact with the user to generate the user data that it provides.

It is noted that host computer 1110, base station 1120 and UE 1130 illustrated in FIG. 11 may be similar or identical to host computer 1030, one of base stations 1012a, 1012b, 1012c and one of UEs 1091, 1092 of FIG. 10, respectively. This is to say, the inner workings of these entities may be as shown in FIG. 11 and independently, the surrounding network topology may be that of FIG. 10.

In FIG. 11, OTT connection 1150 has been drawn abstractly to illustrate the communication between host computer 1110 and UE 1130 via base station 1120, without explicit reference to any intermediary devices and the precise routing of messages via these devices. Network infrastructure may determine the routing, which it may be configured to hide from UE 1130 or from the service provider operating host computer 1110, or both. While OTT connection 1150 is active, the network infrastructure may further take decisions by which it dynamically changes the routing (e.g., on the basis of load balancing consideration or reconfiguration of the network).

Wireless connection 1170 between UE 1130 and base station 1120 is in accordance with the teachings of the embodiments described throughout this disclosure. One or more of the various embodiments improve the performance of OTT services provided to UE 1130 using OTT connection 1150, in which wireless connection 1170 forms the last segment. More precisely, the teachings of these embodiments may improve the latency, signalling overhead, and service interruption and thereby provide benefits such as reduced user waiting time, better responsiveness and extended battery lifetime.

A measurement procedure may be provided for the purpose of monitoring data rate, latency and other factors on which the one or more embodiments improve. There may further be an optional network functionality for reconfiguring OTT connection 1150 between host computer 1110 and UE 1130, in response to variations in the measurement results. The measurement procedure and/or the network functionality for reconfiguring OTT connection 1150 may be implemented in software 1111 and hardware 1115 of host computer 1110 or in software 1131 and hardware 1135 of UE 1130, or both. In embodiments, sensors (not shown) may be deployed in or in association with communication devices through which OTT connection 1150 passes; the sensors may participate in the measurement procedure by supplying values of the monitored quantities exemplified above, or supplying values of other physical quantities from which software 1111, 1131 may compute or estimate the monitored quantities. The reconfiguring of OTT connection 1150 may include message format, retransmission settings, preferred routing etc.; the reconfiguring need not affect base station 1120, and it may be unknown or imperceptible to base station 1120. Such procedures and functionalities may be known and practiced in the art. In certain embodiments, measurements may involve proprietary UE signaling facilitating host computer 1110's measurements of throughput, propagation times, latency and the like. The measurements may be implemented in that software 1111 and 1131 causes messages to be transmitted, in particular empty or 'dummy' messages, using OTT connection 1150 while it monitors propagation times, errors etc.

The transmitting device 101 may comprise an arrangement as shown in FIG. 8 or in FIG. 11.

The transmitting device 101 may comprise an interface unit to facilitate communications between the transmitting device 101 and other nodes or devices, e.g., the receiving device 102, the host computer 1110, or any of the other nodes. In some particular examples, the interface may, for example, include a transceiver configured to transmit and receive radio signals over an air interface in accordance with a suitable standard.

The transmitting device 101 may also comprise a client application 1132 or a client application circuit, which may be configured to communicate user data with a host application circuit in a host computer 1110, e.g., via another link such as 1150.

The receiving device 102 may comprise an arrangement as shown in FIG. 9 or in FIG. 11.

The receiving device 102 may comprise an interface unit to facilitate communications between the receiving device 102 and other nodes or devices, e.g., the transmitting device 101, the host computer 1110, or any of the other nodes. In some particular examples, the interface may, for example, include a transceiver configured to transmit and receive radio signals over an air interface in accordance with a suitable standard.

The receiving device 102 may also comprise a communication interface 1126 and/or a radio interface 1127, which may be configured to communicate user data with a host application circuit in a host computer 1110, e.g., via another link such as 1150.

FIG. 12: Methods Implemented in a Communication System Including a Host Computer, a Base Station and a User Equipment in Accordance with Some Embodiments FIG. 12 is a flowchart illustrating a method implemented in a communication system, in accordance with one embodiment. The communication system includes a host computer, a base station and a UE which may be those described with reference to FIGS. 10 and 11. For simplicity of the present disclosure, only drawing references to FIG. 12 will be included in this section. In step 1210, the host computer provides user data. In substep 1211 (which may be optional) of step 1210, the host computer provides the user data by executing a host application. In step 1220, the host computer initiates a transmission carrying the user data to the UE. In step 1230 (which may be optional), the base station transmits to the UE the user data which was carried in the transmission that the host computer initiated, in accordance with the teachings of the embodiments described throughout this disclosure. In step 1240 (which may also be optional), the UE executes a client application associated with the host application executed by the host computer.

FIG. 13: Methods Implemented in a Communication System Including a Host Computer, a Base Station and a User Equipment in Accordance with Some Embodiments FIG. 13 is a flowchart illustrating a method implemented in a communication system, in accordance with one embodiment. The communication system includes a host computer, a base station and a UE which may be those described with reference to FIGS. 10 and 11. For simplicity of the present disclosure, only drawing references to FIG. 13 will be included in this section. In step 1310 of the method, the host computer provides user data. In an optional substep (not shown) the host computer provides the user data by executing a host application. In step 1320, the host computer initiates a transmission carrying the user data to the UE. The transmission may pass via the base station, in accordance with the teachings of the embodiments described throughout this disclosure. In step 1330 (which may be optional), the UE receives the user data carried in the transmission.

FIG. 14: Methods Implemented in a Communication System Including a Host Computer, a Base Station and a User Equipment in Accordance with Some Embodiments FIG. 14 is a flowchart illustrating a method implemented in a communication system, in accordance with one embodiment. The communication system includes a host computer, a base station and a UE which may be those described with reference to FIGS. 10 and 11. For simplicity of the present disclosure, only drawing references to FIG. 14 will be included in this section. In step 1410 (which may be optional), the UE receives input data provided by the host computer. Additionally or alternatively, in step 1420, the UE provides user data. In substep 1421 (which may be optional) of step 1420, the UE provides the user data by executing a client application. In substep 1411 (which may be optional) of step 1410, the UE executes a client application which provides the user data in reaction to the received input data provided by the host computer. In providing the user data, the executed client application may further consider user input received from the user. Regardless of the specific manner in which the user data was provided, the UE initiates, in substep 1430 (which may be optional), transmission of the user data to the host computer. In step 1440 of the method, the host computer receives the user data transmitted from the UE, in accordance with the teachings of the embodiments described throughout this disclosure.

FIG. 15: Methods Implemented in a Communication System Including a Host Computer, a Base Station and a User Equipment in Accordance with Some Embodiments FIG. 15 is a flowchart illustrating a method implemented in a communication system, in accordance with one embodiment. The communication system includes a host computer, a base station and a UE which may be those described with reference to FIGS. 10 and 11. For simplicity of the present disclosure, only drawing references to FIG. 15 will be included in this section. In step 1510 (which may be optional), in accordance with the teachings of the embodiments described throughout this disclosure, the base station receives user data from the UE. In step 1520 (which may be optional), the base station initiates transmission of the received user data to the host computer. In step 1530 (which may be optional), the host computer receives the user data carried in the transmission initiated by the base station.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

The transmitting device 101 embodiments relate to FIG. 3, FIG. 6, FIG. 7, FIGS. 8, and 11-15.

The receiving device 102 embodiments relate to FIG. 5, FIG. 6, FIG. 7, FIGS. 9, and 11-15.

Further Numbered Embodiments

The communications system embodiments relate to FIGS. 10-15.

The communications system 1100 may comprise the host computer 1111, and at least one of the receiving device 102, and the transmitting device 101.

1. A base station configured to communicate with a user equipment (UE), the base station comprising a radio interface and processing circuitry configured to perform one or more of the actions described herein as performed by the receiving device 102.

5. A communication system including a host computer comprising:
  processing circuitry configured to provide user data; and
  a communication interface configured to forward the user data to a cellular network for transmission to a user equipment (UE),
  wherein the cellular network comprises a base station having a radio interface and processing circuitry, the base station's processing circuitry configured to perform one or more of the actions described herein as performed by the receiving device 102.

6. The communication system of embodiment 5, further including the base station.

7. The communication system of embodiment 6, further including the UE, wherein the UE is configured to communicate with the base station.

8. The communication system of embodiment 7, wherein:
  the processing circuitry of the host computer is configured to execute a host application, thereby providing the user data; and
  the UE comprises processing circuitry configured to execute a client application associated with the host application.

11. A method implemented in a base station, comprising one or more of the actions described herein as performed by the receiving device 102.

15. A method implemented in a communication system including a host computer, a base station and a user equipment (UE), the method comprising:
  at the host computer, providing user data; and
  at the host computer, initiating a transmission carrying the user data to the UE via a cellular network comprising the base station, wherein the base station performs one or more of the actions described herein as performed by the receiving device 102.

16. The method of embodiment 15, further comprising:
  at the base station, transmitting the user data.

17. The method of embodiment 16, wherein the user data is provided at the host computer by executing a host application, the method further comprising:
  at the UE, executing a client application associated with the host application.

21. A user equipment (UE) configured to communicate with a base station, the UE comprising a radio interface and processing circuitry configured to perform one or more of the actions described herein as performed by the transmitting device 101.

25. A communication system including a host computer comprising:
  processing circuitry configured to provide user data; and
  a communication interface configured to forward user data to a cellular network for transmission to a user equipment (UE),
  wherein the UE comprises a radio interface and processing circuitry, the UE's processing circuitry configured to perform one or more of the actions described herein as performed by the transmitting device 101.

26. The communication system of embodiment 25, further including the UE.

27. The communication system of embodiment 26, wherein the cellular network further includes a base station configured to communicate with the UE.

28. The communication system of embodiment 26 or 27, wherein:
  the processing circuitry of the host computer is configured to execute a host application, thereby providing the user data; and
  the UE's processing circuitry is configured to execute a client application associated with the host application.

31. A method implemented in a user equipment (UE), comprising one or more of the actions described herein as performed by the transmitting device 101.

35. A method implemented in a communication system including a host computer, a base station and a user equipment (UE), the method comprising:
  at the host computer, providing user data; and
  at the host computer, initiating a transmission carrying the user data to the UE via a cellular network comprising the base station, wherein the UE performs one or more of the actions described herein as performed by the transmitting device 101.

36. The method of embodiment 35, further comprising:
  at the UE, receiving the user data from the base station.

41. A user equipment (UE) configured to communicate with a base station, the UE comprising a radio interface and processing circuitry configured to perform one or more of the actions described herein as performed by the transmitting device 101.

45. A communication system including a host computer comprising:
  a communication interface configured to receive user data originating from a transmission from a user equipment (UE) to a base station,
  wherein the UE comprises a radio interface and processing circuitry, the UE's processing circuitry configured to:
  perform one or more of the actions described herein as performed by the transmitting device 101.

46. The communication system of embodiment 45, further including the UE.

47. The communication system of embodiment 46, further including the base station, wherein the base station comprises a radio interface configured to communicate with the UE and a communication interface configured to forward to the host computer the user data carried by a transmission from the UE to the base station.

48. The communication system of embodiment 46 or 47, wherein:
the processing circuitry of the host computer is configured to execute a host application; and
the UE's processing circuitry is configured to execute a client application associated with the host application, thereby providing the user data.

49. The communication system of embodiment 46 or 47, wherein:
the processing circuitry of the host computer is configured to execute a host application, thereby providing request data; and
the UE's processing circuitry is configured to execute a client application associated with the host application, thereby providing the user data in response to the request data.

51. A method implemented in a user equipment (UE), comprising one or more of the actions described herein as performed by the transmitting device 101.

52. The method of embodiment 51, further comprising:
providing user data; and
forwarding the user data to a host computer via the transmission to the base station.

55. A method implemented in a communication system including a host computer, a base station and a user equipment (UE), the method comprising:
at the host computer, receiving user data transmitted to the base station from the UE, wherein the UE performs one or more of the actions described herein as performed by the transmitting device 101.

56. The method of embodiment 55, further comprising:
at the UE, providing the user data to the base station.

57. The method of embodiment 56, further comprising:
at the UE, executing a client application, thereby providing the user data to be transmitted; and
at the host computer, executing a host application associated with the client application.

58. The method of embodiment 56, further comprising:
at the UE, executing a client application; and
at the UE, receiving input data to the client application, the input data being provided at the host computer by executing a host application associated with the client application,
wherein the user data to be transmitted is provided by the client application in response to the input data.

61. A base station configured to communicate with a user equipment (UE), the base station comprising a radio interface and processing circuitry configured to perform one or more of the actions described herein as performed by the receiving device 102.

65. A communication system including a host computer comprising a communication interface configured to receive user data originating from a transmission from a user equipment (UE) to a base station, wherein the base station comprises a radio interface and processing circuitry, the base station's processing circuitry configured to perform one or more of the actions described herein as performed by the receiving device 102.

66. The communication system of embodiment 65, further including the base station.

67. The communication system of embodiment 66, further including the UE, wherein the UE is configured to communicate with the base station.

68. The communication system of embodiment 67, wherein:
the processing circuitry of the host computer is configured to execute a host application;
the UE is configured to execute a client application associated with the host application, thereby providing the user data to be received by the host computer.

71. A method implemented in a base station, comprising one or more of the actions described herein as performed by the receiving device 102.

75. A method implemented in a communication system including a host computer, a base station and a user equipment (UE), the method comprising:
at the host computer, receiving, from the base station, user data originating from a transmission which the base station has received from the UE, wherein the UE performs one or more of the actions described herein as performed by the transmitting device 101.

76. The method of embodiment 75, further comprising:
at the base station, receiving the user data from the UE.

77. The method of embodiment 76, further comprising:
at the base station, initiating a transmission of the received user data to the host computer.

REFERENCES

[1] IETF RFC 1951, "DEFLATE Compressed Data Format Specification version 1.3".
[2] 3gpp TS 36.323, "Evolved Universal Terrestrial Radio Access (E-UTRA); Packet Data Convergence Protocol (PDCP) specification".
[3] 3gpp TR 36.754 v.0.0.2, "Study on UL data compression for E-UTRA (Release 15)".
[4] RP-172076, "UL data compression in LTE" UDC WI
[5] R2-1712070, "Running 36.323 CR for Introduction of UDC"

Abbreviations

At least some of the following abbreviations may be used in this disclosure. If there is an inconsistency between abbreviations, preference should be given to how it is used above. If listed multiple times below, the first listing should be preferred over any subsequent listing(s).
3GPP 3rd Generation Partnership Project
5G 5th Generation
DL Downlink
eNB E-UTRAN NodeB
E-UTRA Evolved UTRA
E-UTRAN Evolved UTRAN
GERAN GSM EDGE Radio Access Network
gNB Base station in NR
GSM Global System for Mobile communication
HSPA High Speed Packet Access
LTE Long-Term Evolution
OFDM Orthogonal Frequency Division Multiplexing
PDCP Packet Data Convergence Protocol
UE User Equipment
UL Uplink
UMTS Universal Mobile Telecommunication System
UTRA Universal Terrestrial Radio Access
UTRAN Universal Terrestrial Radio Access Network
WCDMA Wide CDMA
WLAN Wide Local Area Network
UDC Uplink Data Compression

The invention claimed is:

1. A method performed by a transmitting device operating in a communications network, the method comprising:
performing a reset on a buffer of the transmitting device,
switching, based on the performed reset, a first value in an indication to a second value, the indication being of the reset of the buffer, and setting the indication to the second value for all packets generated by the transmitting device after the performed reset, until the second value is switched again by the transmitting device in another indication, based on another performed reset of the buffer,
sending the indication with the second value to a receiving device operating in the communications network, the second value indicating that the reset was performed by the transmitting device, wherein the indication is a field of an Uplink Data Compression, UDC, header in a Protocol Data Unit, PDU;
performing one of: decompressing one or more first packets generated before performing the reset of the buffer and not yet sent to the receiving device or not yet submitted to lower layers; and
compressing an uncompressed copy of the one or more first packets generated before performing the reset of the buffer and at least one of: a) not yet sent to the receiving device and b) not yet submitted to lower layers;
decompressing one or more first packets generated before performing the reset of the buffer and at least one of: a) not yet sent to the receiving device, and b) not yet submitted to lower layers; and
compressing an uncompressed copy of the one or more first packets generated before performing the reset of the buffer and at least one of: a) not yet sent to the receiving device and b) not yet submitted to lower layers.

2. A method performed by a receiving device operating in a communications network, the method comprising:
receiving an indication with a second value from a transmitting device operating in the communications network, the second value indicating that a reset on a buffer of the transmitting device was performed by the transmitting device, wherein the indication is set to the second value for all packets generated by the transmitting device after the performed reset, until another indication with the second value switched is received from the transmitting device, based on another performed reset of the buffer, and
processing, based on the received indication, one or more packets received from the transmitting device, wherein the indication is a field of an Uplink Data Compression, UDC, header in a Protocol Data Unit, PDU; and
receiving, from the transmitting device, the one or more packets, wherein the one or more packets comprise one or more of:
a) one or more second packets, and
b) one or more third packets based on one of: a) decompressed one or more first packets generated before the reset of the buffer having been performed and at least one of: a) not yet sent to the receiving device, and b) not yet submitted to lower layers and c) a compressed, uncompressed copy of the one or more first packets generated before the reset of the buffer having been performed and at least one of: a) not yet sent to the receiving device and b) not yet submitted to lower layers.

3. A transmitting device configured to operate in a communications network, the transmitting device being further configured to:
perform a reset on a buffer of the transmitting device,
switch, based on the reset configured to be performed, a first value in an indication to a second value, the indication being configured to be of the reset of the buffer, and to set the indication to the second value for all packets configured to be generated by the transmitting device after the reset configured to be performed, until the second value is configured to be switched again by the transmitting device in another indication, based on another reset of the buffer configured to be performed, and
send the indication with the second value to a receiving device configured to operate in the communications network, the second value being configured to indicate that the reset was performed by the transmitting device, wherein the indication is configured to be a field of an Uplink Data Compression, UDC, header in a Protocol Data Unit, PDU;
wherein transmitting device is further configured to perform one of:
decompress one or more first packets configured to be generated before the reset of the buffer is configured to be performed, and at least one of: a) not yet sent to the receiving device, and b) not yet submitted to lower layers; and
compress an uncompressed copy of the one or more first packets configured to be generated before the reset of the buffer is configured to be performed, and at least one of: a) not yet sent to the receiving device and b) not yet submitted to lower layers, and wherein the transmitting device is further configured to:
send one or more packets to the receiving device, the one or more packets being configured to comprise at least one of:
a) one or more second packets, and
b) one or more third packets based on one of:
a) the one or more first packets configured to be decompressed, and
b) the uncompressed copy of the one or more first packets configured to be compressed.

4. A receiving device configured to operate in a communications network, the receiving device being further configured to:
receive an indication with a second value from a transmitting device configured to operate in the communications network, the second value being configured to indicate that a reset on a buffer of the transmitting device was performed by the transmitting device, wherein the indication is configured to be set to the second value for all packets configured to be generated by the transmitting device after the reset configured to be performed, until another indication with the second value switched is configured to be received from the transmitting device, based on another reset of the buffer configured to be performed, and
process, based on the indication configured to be received, one or more packets configured to be received from the transmitting device, wherein the indication is configured to be a field of an Uplink Data Compression, UDC, header in a Protocol Data Unit, PDU; and
receive, from the transmitting device, the one or more packets, wherein the one or more packets are further configured to comprise one or more of:

a) one or more second packets, and
b) one or more third packets based on one of:
   a) decompressed one or more first packets configured to be generated before the reset of the buffer configured to have been performed, and at least one of: a) not yet sent to the receiving device, and b) not yet submitted to lower layers and
   b) a compressed, uncompressed copy of the one or more first packets configured to be generated before the reset of the buffer configured to have been performed and at least one of: a) not yet sent to the receiving device and b) not yet submitted to lower layers.

\* \* \* \* \*